(12) United States Patent
Roh

(10) Patent No.: US 12,213,313 B2
(45) Date of Patent: Jan. 28, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventor: Junghyun Roh, Asan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 457 days.

(21) Appl. No.: 17/570,828

(22) Filed: Jan. 7, 2022

(65) Prior Publication Data
US 2022/0375953 A1    Nov. 24, 2022

(30) Foreign Application Priority Data

May 21, 2021    (KR) .................... 10-2021-0065599

(51) Int. Cl.
*H10B 41/40*    (2023.01)
*H01L 23/522*    (2006.01)
(Continued)

(52) U.S. Cl.
CPC ......... *H10B 41/40* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 43/40* (2023.02)

(58) Field of Classification Search
CPC ........ H10B 41/40; H10B 41/10; H10B 41/27; H10B 41/35; H10B 43/10; H10B 43/27; H10B 43/35; H10B 43/40; H10B 43/50; H10B 43/30; H10B 43/20; H01L 23/5226; H01L 23/5283; H01L 21/823475; H01L 25/0657; H01L 2225/06541; H01L 27/11514; H01L 27/115; H01L 27/11597

See application file for complete search history.

(56) References Cited

U.S. PATENT DOCUMENTS 9,478,561 B2    10/2016    Kim et al.
9,972,640 B1    5/2018    Kai et al.
(Continued)

FOREIGN PATENT DOCUMENTS

KR    10-1935860 B1    1/2019

*Primary Examiner* — Mohammad A Rahman
(74) *Attorney, Agent, or Firm* — Harness, Dickey & Pierce, P.L.C.

(57) ABSTRACT

A semiconductor device including a peripheral circuit structure on a substrate, a horizontal layer on the peripheral circuit structure, an electrode structure including electrodes on the horizontal layer, the electrodes including pads arranged in a stepwise shape, a planarization insulating layer covering the pads, a contact plug penetrating the planarization insulating layer and coupled to one of the pads, a penetration via penetrating the planarization insulating layer and coupled to the peripheral circuit structure, and a vertical conductive structure between the electrode structure and the penetration via may be provided. The vertical conductive structure may have a bottom surface located at a level that is higher than a top surface of the horizontal layer and is lower than a bottom end of the contact plug.

20 Claims, 29 Drawing Sheets

(51) Int. Cl.
*H01L 23/528* (2006.01)
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)
*H10B 43/40* (2023.01)

(56) References Cited

U.S. PATENT DOCUMENTS

| | | |
|---|---|---|
| 10,373,969 B2 | 8/2019 | Zhang et al. |
| 10,680,012 B2 | 6/2020 | Asai et al. |
| 10,892,272 B2 | 1/2021 | Hwang et al. |
| 2014/0015115 A1 | 1/2014 | Nam |
| 2017/0221919 A1 | 8/2017 | Chung |
| 2020/0119031 A1 | 4/2020 | Shen et al. |
| 2020/0266206 A1* | 8/2020 | Fukuo .................. H10B 41/27 |

* cited by examiner

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0065599, filed on May 21, 2021, in the Korean Intellectual Property Office, the entire contents of which are hereby incorporated by reference.

BACKGROUND

The present disclosure relates to semiconductor devices and/or electronic systems including the same.

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, semiconductor memory devices including three-dimensionally arranged memory cells have recently been proposed.

SUMMARY

Some example embodiments of the inventive concepts provide semiconductor devices with improved reliability and durability.

Some example embodiments of the inventive concepts provide electronic systems including the semiconductor device.

According to an example embodiment of the inventive concepts, a semiconductor device may include a peripheral circuit structure on a substrate, a horizontal layer on the peripheral circuit structure, an electrode structure including electrodes on the horizontal layer, the electrodes including pads arranged in a stepwise shape, a planarization insulating layer covering the pads, a contact plug penetrating the planarization insulating layer and coupled to one of the pads, a penetration via penetrating the planarization insulating layer and coupled to the peripheral circuit structure, and a vertical conductive structure between the electrode structure and the penetration via. The vertical conductive structure may have a bottom surface located at a level that is higher than a top surface of the horizontal layer and is lower than a bottom end of the contact plug.

According to an example embodiment of the inventive concepts, a semiconductor device may include a substrate including a cell array region, a connection region, and a peripheral line region, which are arranged in a first direction, a peripheral circuit structure having a peripheral circuit on the substrate and a landing pad connected to the peripheral circuit, a horizontal layer on the peripheral circuit structure, an electrode structure including electrodes stacked on the horizontal layer, the electrodes having a staircase structure on the connection region, an electrode separation structure crossing the electrode structure in the first direction, vertical channel structures on the cell array region and penetrating the electrode structures, a planarization insulating layer covering the electrode structure, a contact plug on the connection region, the contact plug penetrating the planarization insulating layer and coupled to one of the electrodes, a penetration via on the peripheral line region and penetrating the planarization insulating layer and coupled to the landing pad, an upper interconnection line on the planarization insulating layer, the upper interconnection line connecting the contact plug to the penetration via, and a vertical conductive structure between the electrode structure and the penetration via. The vertical conductive structure may have a bottom surface covered with the planarization insulating layer.

According to an example embodiment of the inventive concepts, an electronic system may include a main substrate, a semiconductor device on the main substrate, and a controller on the main substrate and electrically connected to the semiconductor device. The semiconductor device may include a peripheral circuit structure having a peripheral circuit on a substrate and a landing pad connected to the peripheral circuit, an electrode structure including electrodes stacked on the peripheral circuit structure, the electrodes including pads arranged in a stepwise shape, a planarization insulating layer covering the pads, a contact plug penetrating the planarization insulating layer and coupled to one of the pads, a penetration via penetrating the planarization insulating layer and coupled to the landing pad, and a vertical conductive structure between the contact plug and the penetration via. The vertical conductive structure may have a bottom surface covered with the planarization insulating layer.

DETAILED DESCRIPTION

Example embodiments of the inventive concepts will now be described more fully with reference to the accompanying drawings, in which some example embodiments are shown.

Figure 1:
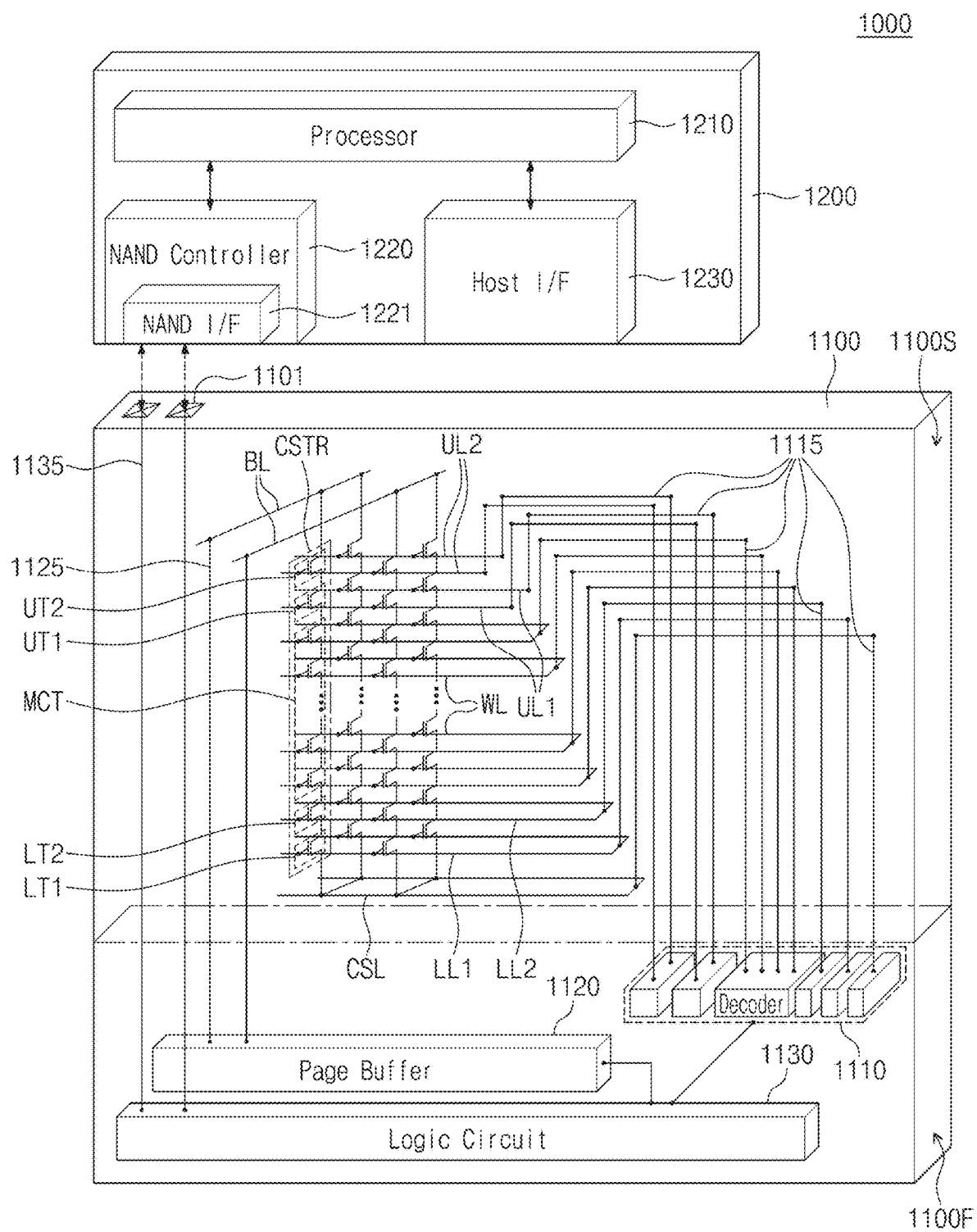
FIG. 1 is a diagram schematically illustrating an electronic system including a semiconductor device according to an example embodiment of the inventive concepts.

FIG. 1 is a diagram schematically illustrating an electronic system including a semiconductor device according to an example embodiment of the inventive concepts.

Referring to FIG. 1, an electronic system 1000 according to an example embodiment of the inventive concepts may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. As an example, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to example embodiments.

In an example embodiment, at least one of the upper transistors UT1 and UT2 may include the string selection transistor, and at least one of the lower transistors LT1 and LT2 may include a ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an example embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from a region in the first structure 1100F to a region in the second structure 1100S. The bit lines BL may be electrically connected to the page buffer 1120 through second connection lines 1125, which are extended from a region in the first structure 1100F to a region in the second structure 1100S.

In the first structure 1100F, the decoder circuit 1110 and the page buffer 1120 may be configured to perform a control operation on at least selected one of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is provided in the first structure 1100F and is extended into the second structure 1100S.

The controller 1200 may include a processor 1210, a NAND controller 1220, and a host interface 1230. In an example embodiment, the electronic system 1000 may include a plurality of semiconductor devices 1100, and in this case, the controller 1200 may control the semiconductor devices 1100.

The processor 1210 may control overall operations the electronic system 1000 including the controller 1200. The processor 1210 may be operated depending on a specific firmware and may control the NAND controller 1220 to access the semiconductor device 1100. The NAND controller 1220 may include a NAND interface 1221, which is used for communication with the semiconductor device 1100. The NAND interface 1221 may be used to transmit and receive control commands, which are used to control the semiconductor device 1100, data, which will be written in or read from the memory cell transistors MCT of the semiconductor device 1100, and so forth. The host interface 1230 may be configured to allow for communication between the electronic system 1000 and an external host. When a control command is received from the external host through the host interface 1230, the processor 1211 may control the semiconductor device 1100 in response to the control command.

Figure 2:
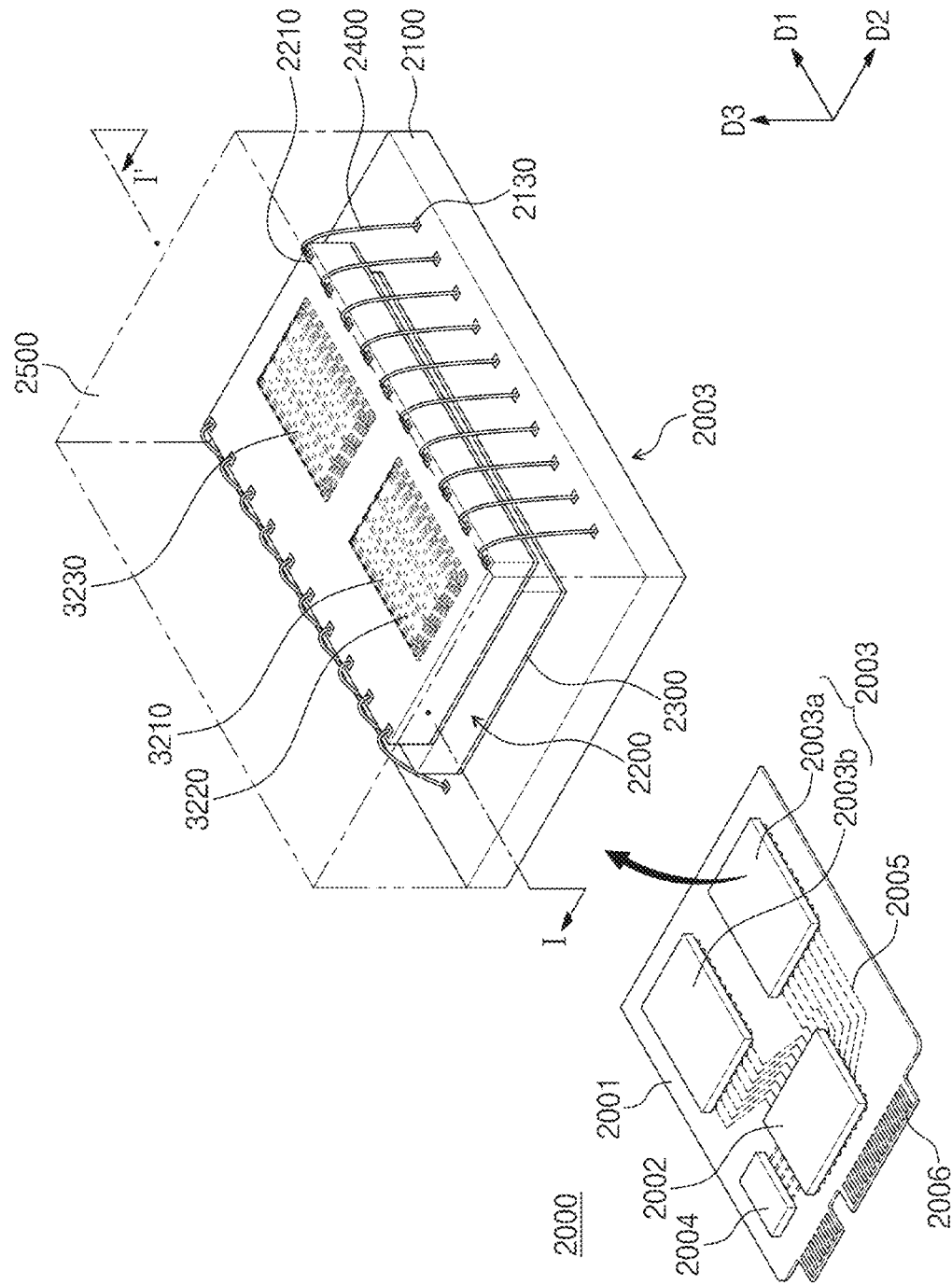
FIG. 2 is a perspective view schematically illustrating an electronic system including a semiconductor device, according to an example embodiment of the inventive concepts.

FIG. 2 is a perspective view schematically illustrating an electronic system including a semiconductor device, according to an example embodiment of the inventive concepts.

Referring to FIG. 2, an electronic system 2000 according to an example embodiment of the inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins to be coupled to an external host. In the connector 2006, the number and arrangement of the pins may depend on a communication interface between the electronic system 2000 and the external host. In an example embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an example embodiment, the electronic system 2000 may be driven by an electric power, which is supplied from the external host through the connector 2006. The electronic system 2000 may further include a power management integrated circuit (PMIC) that is configured to separately supply an electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an example embodiment, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to control the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pad portions 2130. Each of the semiconductor chips 2200 may include an input/output pad portion 2210. The input/output pad portion 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to an example embodiment of the inventive concepts.

In an example embodiment, the connection structure 2400 may be a bonding wire electrically connecting the input/output pad portion 2210 to the package upper pad portions 2130. In each of the first and second semiconductor packages 2003a and 2003b, the semiconductor chips 2200 may be electrically connected to each other in a bonding wire manner and may be electrically connected to the package upper pad portions 2130 of the package substrate 2100. In some example embodiments, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an example embodiment, the controller 2002 and the semiconductor chips 2200 may be included in a single package. In an example embodiment, the controller 2002 and the semiconductor chips 2200 may be mounted on a separate interposer substrate, which is prepared independent of the main substrate 2001, and may be connected to each other through interconnection lines, which are provided in the interposer substrate.

Figure 3:
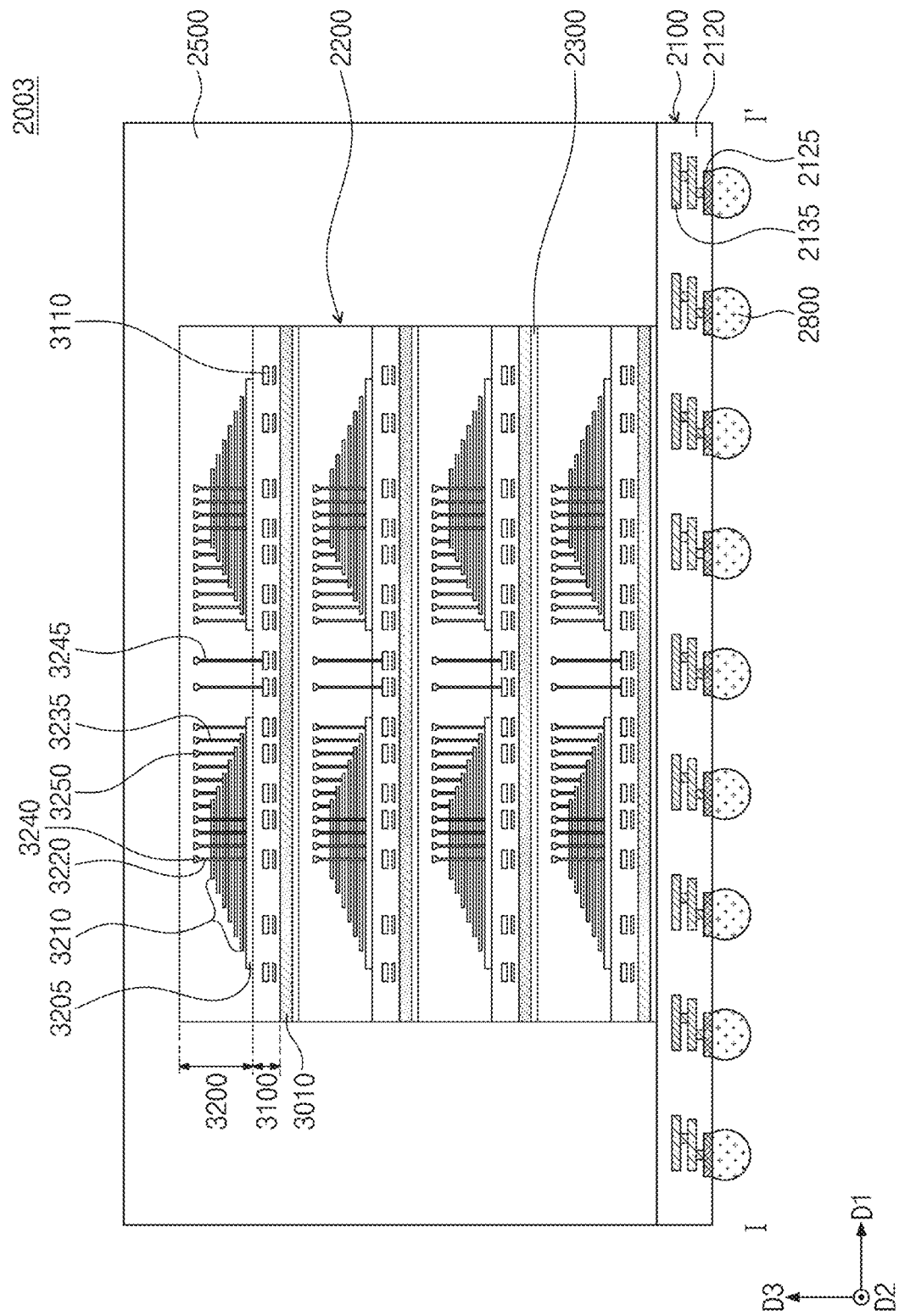
FIGS. 3 and 4 are sectional views, each of which schematically illustrates a semiconductor package according to an example embodiment of the inventive concepts.
Figure 4:
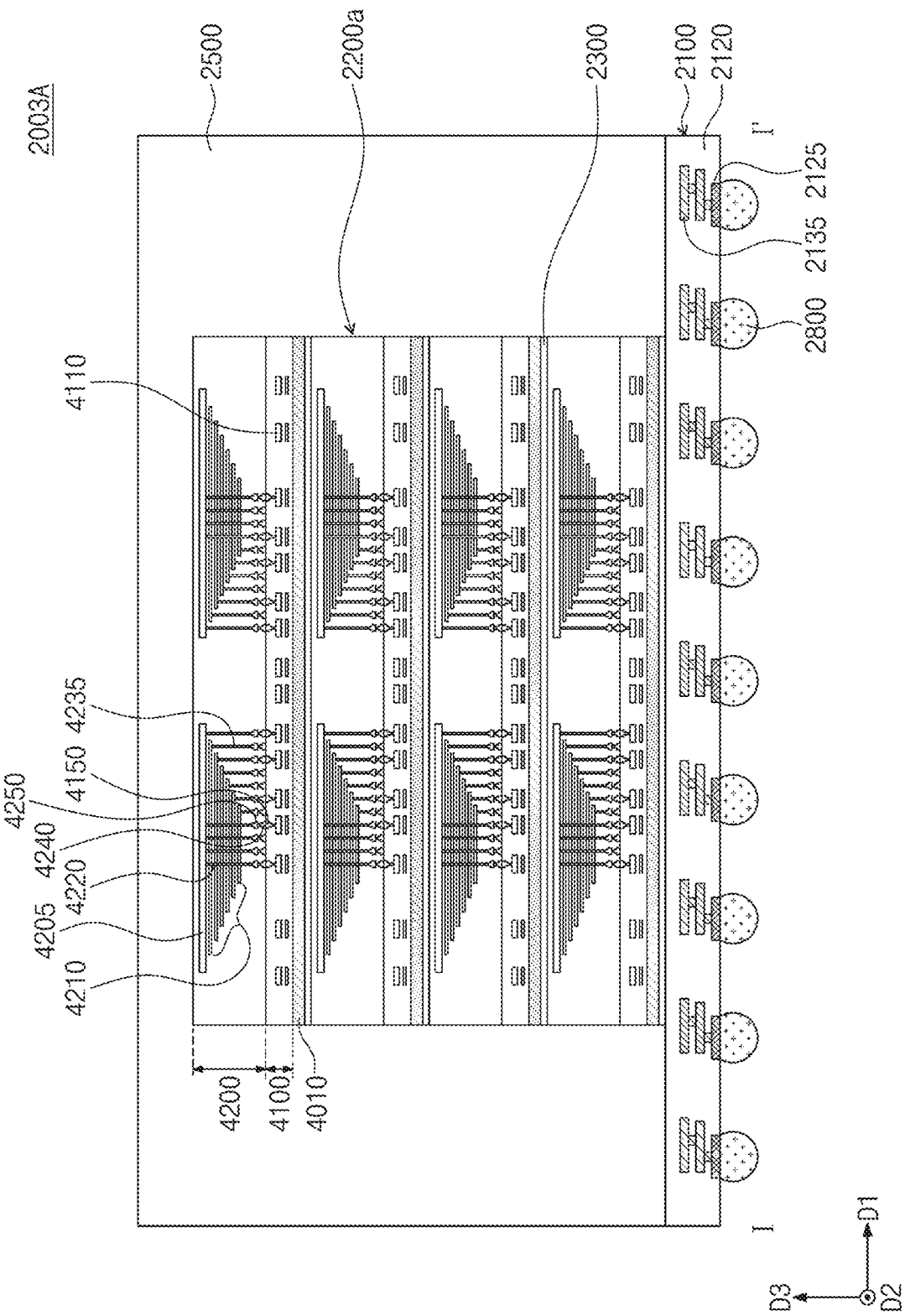

FIGS. 3 and 4 are sectional views, each of which schematically illustrates a semiconductor package according to an example embodiment of the inventive concepts. FIGS. 3 and 4 conceptually illustrate two different examples of the semiconductor package of FIG. 2 and are, for example, sectional views taken along a line I-I' of FIG. 2.

Referring to FIG. 3, in the semiconductor package 2003, the package substrate 2100 may be a printed circuit board. The package substrate 2100 may include a package substrate body portion 2120, the package upper pad portions 2130 (e.g., of FIG. 2) disposed on a top surface of the package substrate body portion 2120, lower pad portions 2125, which are disposed on or exposed through a bottom surface of the package substrate body portion 2120, and internal lines 2135, which are provided in the package substrate body portion 2120 to electrically connect the package upper pad portions 2130 to the lower pad portions 2125. The lower pad portions 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the gate stack 3210 on the source structure 3205, the vertical structures 3220 penetrating the gate stack 3210, bit lines 3240 electrically connected to the vertical structures 3220, and cell contact plugs 3235 electrically connected to the word lines WL (e.g., see FIG. 1) of the gate stack 3210. The second structure 3200 may further include separation structures 3230 (e.g., see FIG. 2), which will be described in more detail below.

Each of the semiconductor chips 2200 may include penetration lines 3245, which are electrically connected to the peripheral lines 3110 of the first structure 3100 and are extended into the second structure 3200. The penetration line 3245 may be disposed outside the gate stack 3210 or may be disposed to penetrate the gate stack 3210. Each of the semiconductor chips 2200 may further include the input/output pad portions 2210 (e.g., of FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a gate stack 4210 between the source structure 4205 and the first structure 4100, vertical structures 4220 penetrating the gate stack 4210, and second junction structures 4240 electrically connected to the vertical structures 4220 and the word lines WL (e.g., see FIG. 1) of the gate stack 4210. For example, the second junction structures 4240 may be electrically connected to the vertical structures 4220 and the word lines WL (e.g., see FIG. 1) respectively through bit lines 4250, which are electrically connected to the vertical structures 4220, and cell contact plugs 4235, which are electrically connected to the word lines WL (e.g., see FIG. 1), respectively. The first junction structures 4150 of the first structure 4100 and the second junction structures 4240 of the second structure 4200 may be in contact with each other and may be bonded to each other. Portions of the first and second junction structures 4150 and 4240, which are bonded to each other, may be formed of, for example, copper (Cu). Each of the semiconductor chips 2200a may further include the input/output pad portions 2210 (e.g., see FIG. 2), which are electrically connected to the peripheral lines 4110 of the first structure 4100.

The semiconductor chips 2200 of FIG. 3 and the semiconductor chips 2200a of FIG. 4 may be connected to each other by the connection structures 2400 (e.g., see FIG. 2), which are provided in the form of bonding wires. However, in some example embodiments, the semiconductor chips (e.g., 2200 or 2200a), which are provided in each semiconductor package, may be electrically connected to each other by a connection structure including through silicon vias (TSVs).

The first structure 3100 of FIG. 3 and the first structure 4100 of FIG. 4 may correspond to a peripheral circuit structure in the example embodiments to be described below, and the second structure 3200 of FIG. 3 and the second structure 4200 of FIG. 4 may correspond to a cell array structure in the example embodiments to be described below.

Figure 5:
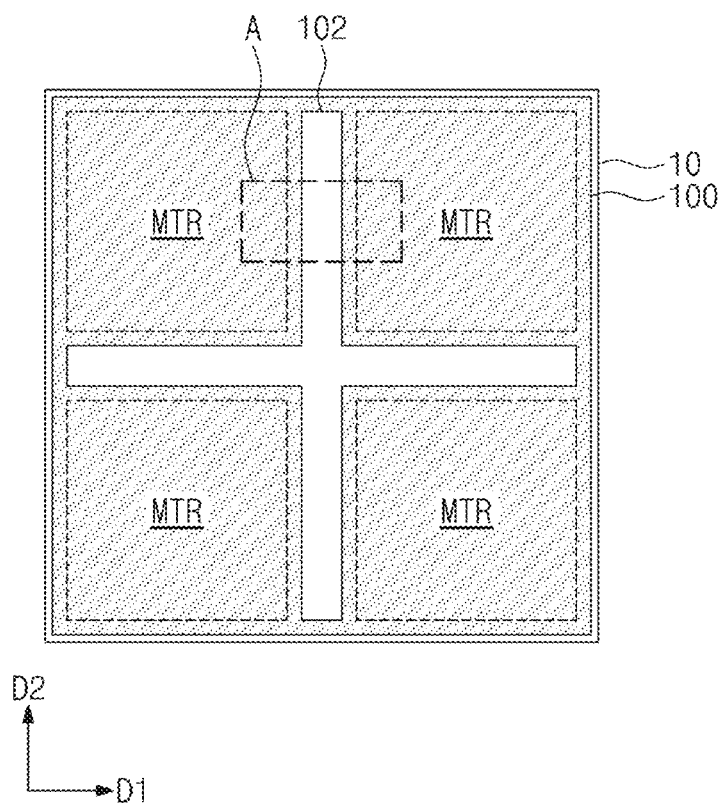
FIG. 5 is a plan view schematically illustrating a semiconductor device according to an example embodiment of the inventive concepts.

FIG. 5 is a plan view schematically illustrating a semiconductor device according to an example embodiment of the inventive concepts.

Referring to FIG. 5, the semiconductor device may include a substrate 10, a horizontal layer 100 on the substrate 10, and a plurality of mat regions MTR on the horizontal layer 100. Each of the mat regions MTR may include a plurality of memory blocks. Each of the memory blocks may be a unit size of data to be erased during an erase operation. Each of the memory blocks may include a plurality of pages. The pages may include the second structure 1100S described with reference to FIG. 1. The page may be a unit size of data to be read or written during a reading or writing operation and may include a plurality of unit memory cells.

Each of the mat regions MTR may be controlled through a peripheral circuit structure formed between the substrate 10 and the horizontal layer 100. The peripheral circuit structure may include the first structure 1100F described with reference to FIG. 1. The horizontal layer 100 may be formed on the peripheral circuit structure and may have a flat top surface, on which the mat regions MTR are formed. The mat regions MTR may be arranged in a first direction D1 and a second direction D2, which are parallel to the top surface of the horizontal layer 100.

A buried insulating pattern 102 may be formed between the mat regions MTR. The buried insulating pattern 102 may be extended in the first and second directions D1 and D2 to cross at least a portion of the horizontal layer 100. In an example embodiment, the buried insulating pattern 102 may be provided to fully cross the horizontal layer 100 or to divide the horizontal layer 100 into a plurality of electrically-separated regions. The mat regions MTR and the peripheral circuit structure may be connected to each other through penetration vias, which are formed to penetrate the buried insulating pattern 102. The penetration vias may include the first connection lines 1115 described with reference to FIG. 1.

Figure 6:
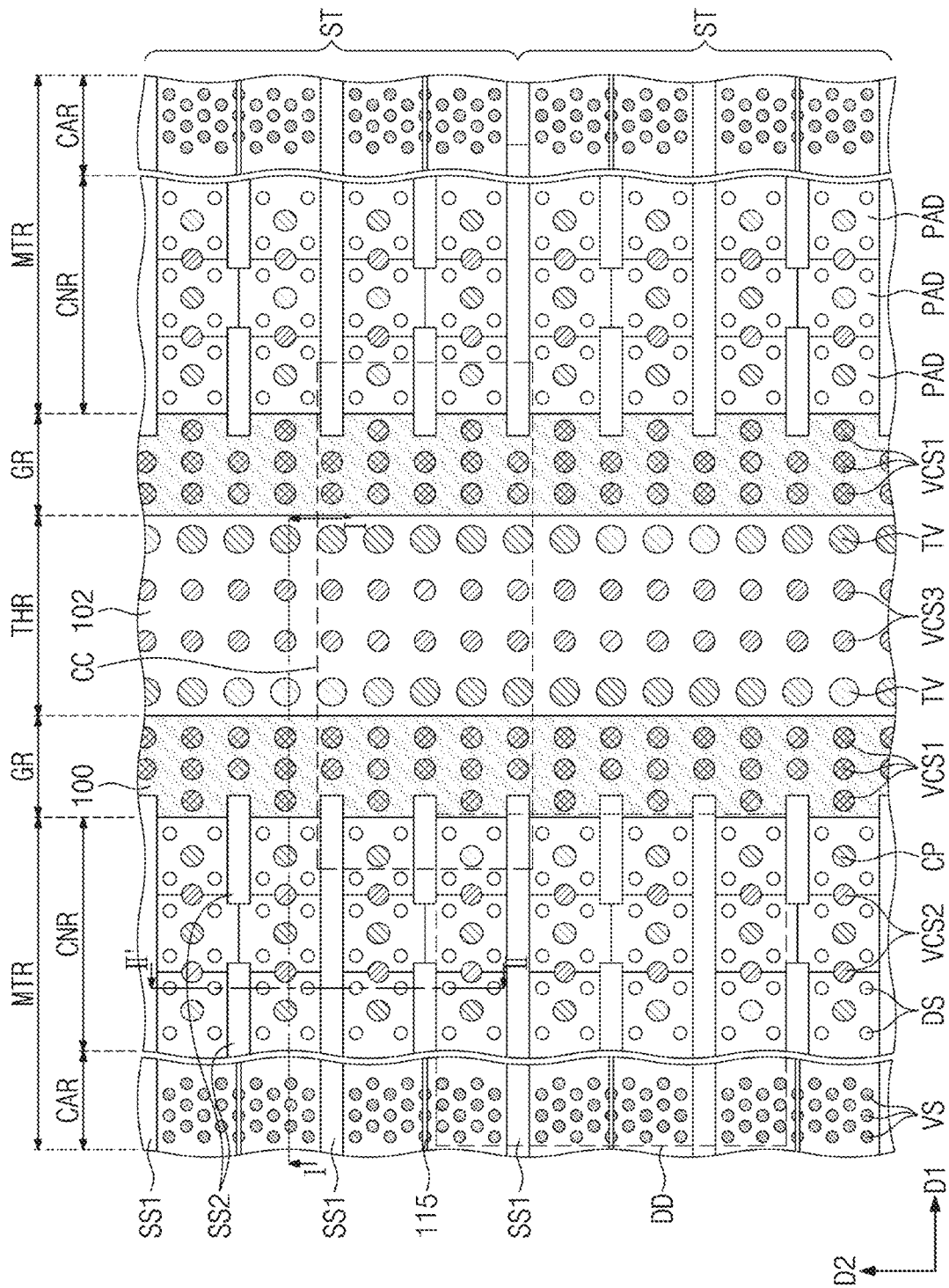
FIG. 6 is a plan view illustrating a portion (e.g., a portion 'A' of FIG. 5) of a semiconductor device according to an example embodiment of the inventive concepts.
Figure 7:
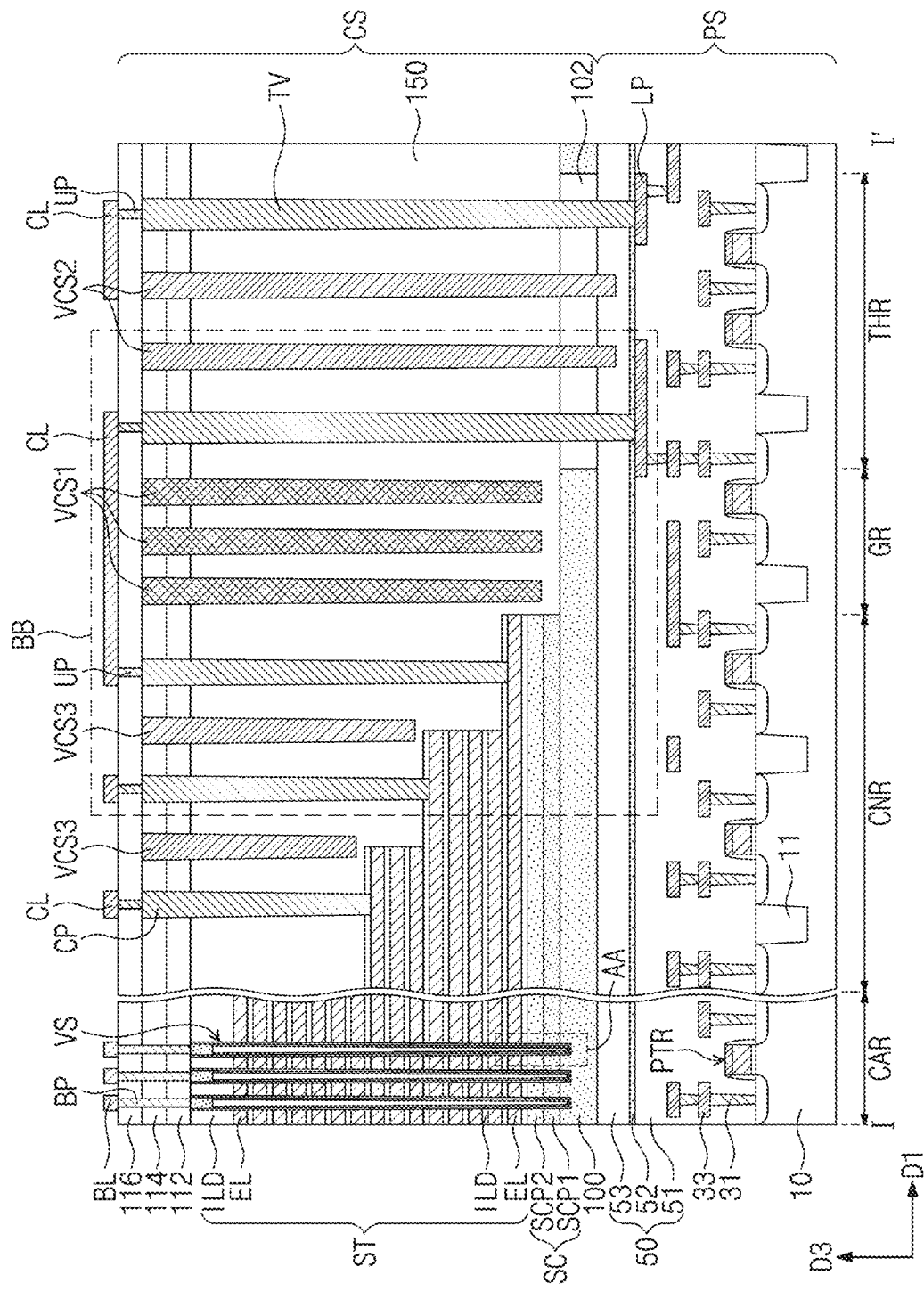
FIGS. 7 and 8 are sectional views taken along lines I-I' and II-II' of FIG. 6.
Figure 8:
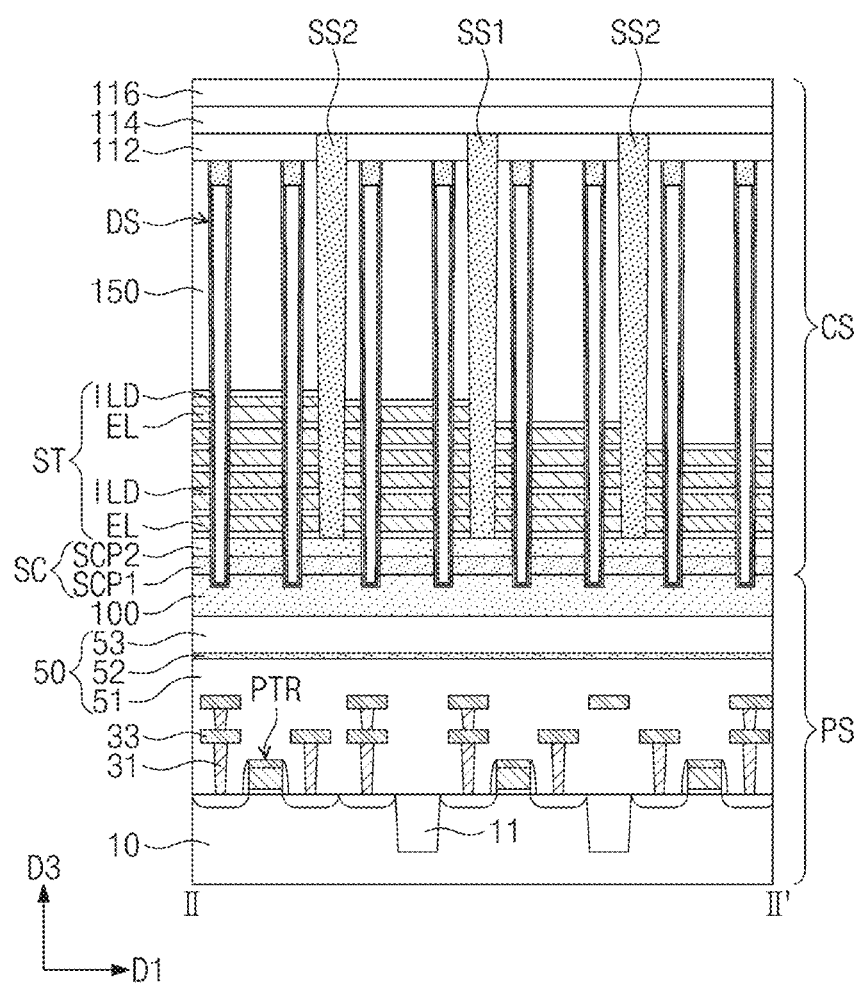
Figure 9:
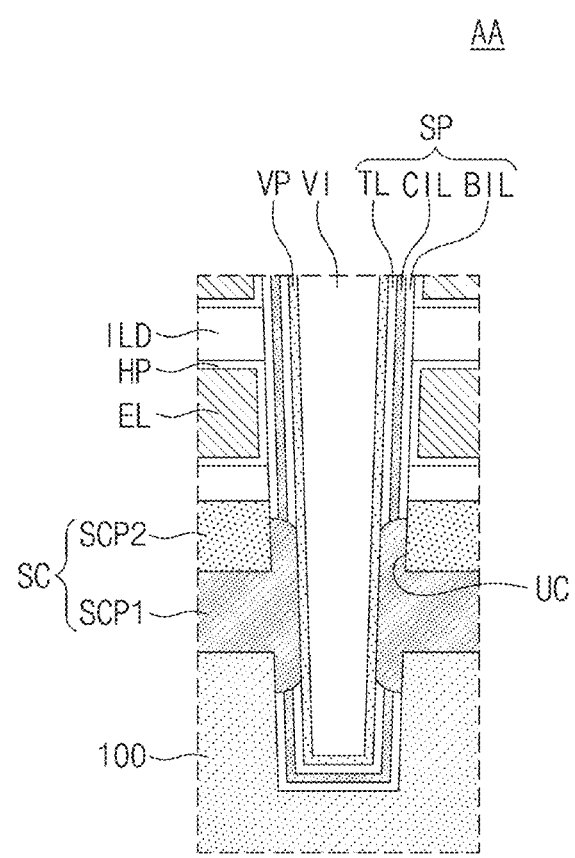
FIGS. 9 and 10 are enlarged sectional views illustrating portions 'AA' and 'BB', respectively, of FIG. 7.
Figure 10:
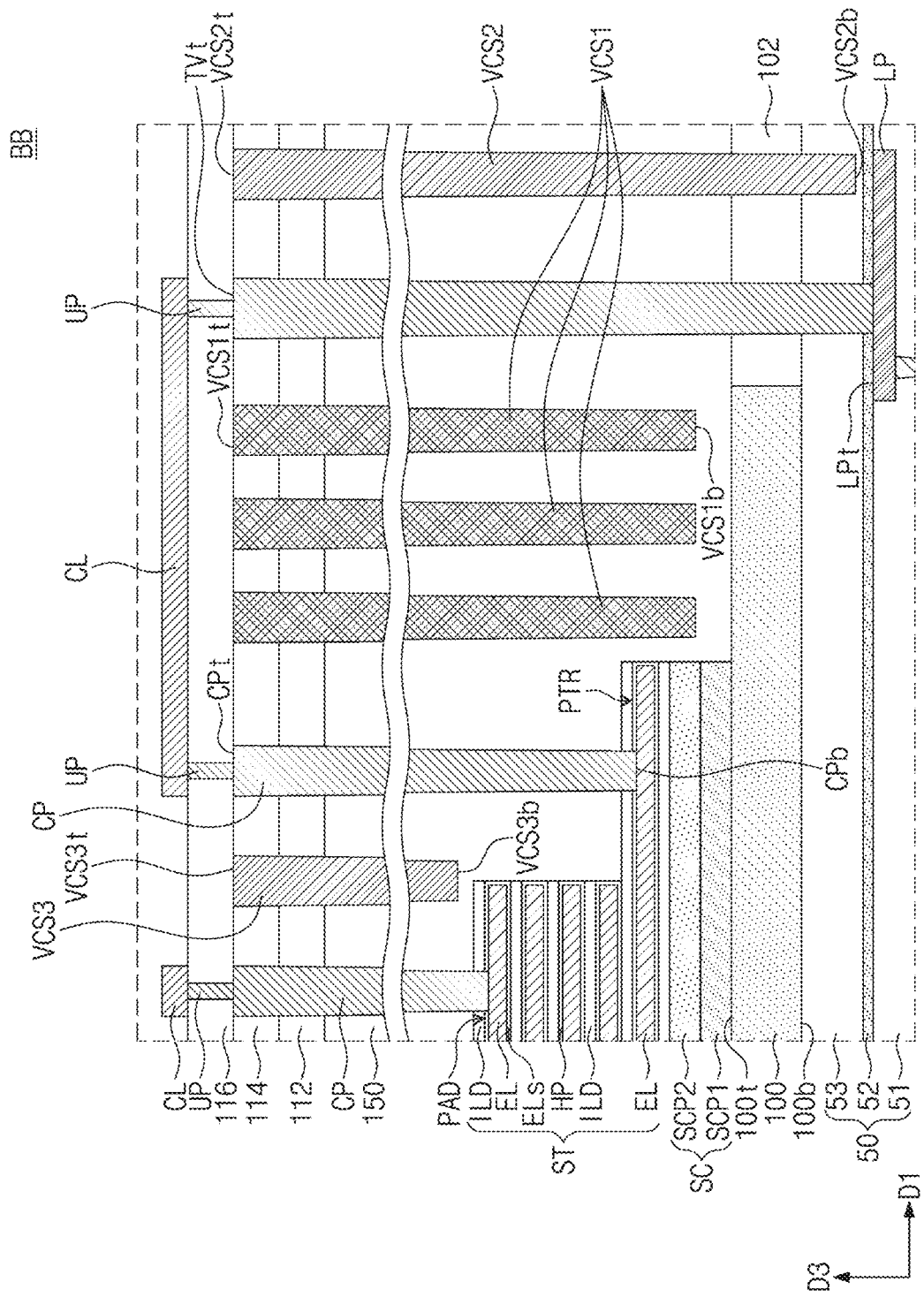

FIG. 6 is a plan view illustrating a portion (e.g., a portion 'A' of FIG. 5) of a semiconductor device according to an example embodiment of the inventive concepts. FIGS. 7 and 8 are sectional views taken along lines I-I' and II-II' of FIG. 6. FIGS. 9 and 10 are enlarged sectional views illustrating portions 'AA' and 'BB' of FIG. 7, respectively.

Referring to FIGS. 6 to 8, a peripheral circuit structure PS may include peripheral logic circuits PTR integrated on a top surface of the substrate 10, a lower insulating gapfill layer 50 covering the peripheral logic circuits PTR, and peripheral circuit interconnection lines 33 in the lower insulating gapfill layer 50. The substrate 10 may be a silicon substrate, a silicon-germanium substrate, a germanium substrate, or a single-crystalline epitaxial layer grown on a single-crystalline silicon substrate. The substrate 10 may include active regions defined by a device isolation layer 11. The substrate 10 may include mat regions MTR, a penetration interconnection region THR between the mat regions MTR, and gap regions GR between the mat regions MTR and the penetration interconnection region THR.

The peripheral logic circuits PTR may include the row and column decoders, the page buffer, and the control circuit described with reference to FIG. 1. The peripheral logic circuits PTR may include NMOS and PMOS transistors, low- and high-voltage transistors, and resistors, which are integrated on the substrate 10. The peripheral circuit interconnection lines 33 and landing pads LP may be electrically connected to the peripheral logic circuits PTR through peripheral contact plugs 31.

The lower insulating gapfill layer 50 may be provided on the top surface of the substrate 10. The lower insulating gapfill layer 50 may cover the peripheral logic circuits PTR, the peripheral contact plugs 31, the peripheral circuit interconnection lines 33, and the landing pads LP. The lower insulating gapfill layer 50 may include a first lower layer 51, a second lower layer 52, and a third lower layer 53, which are sequentially stacked. The second lower layer 52 may have a thickness that is smaller than the first lower layer 51 and the third lower layer 53. Each of the first lower layer 51, the second lower layer 52, and the third lower layer 53 may include, for example, a silicon oxide layer, a silicon nitride layer, a silicon oxynitride layer, and/or a low-k dielectric layer. The second lower layer 52 may be formed of or include at least one of materials having an etch selectivity with respect to the first lower layer 51 and the third lower layer 53. In an example embodiment, the second lower layer 52 may serve as an etch stop layer.

The peripheral contact plugs 31, the peripheral circuit interconnection lines 33, and the landing pads LP may be provided between the second lower layer 52 and the top surface of the substrate 10. The landing pads LP may be electrically connected to the peripheral circuit interconnection lines 33 through the peripheral contact plugs 31. The peripheral circuit interconnection lines 33 may be electrically connected to the peripheral logic circuits PTR through the peripheral contact plugs 31. The landing pads LP may have top surfaces which are located at a level adjacent to a top surface of the first lower layer 51. In an example embodiment, the landing pads LP may have a thickness that is larger than the peripheral circuit interconnection lines 33.

A cell array structure CS may be disposed on the lower insulating gapfill layer 50. The cell array structure CS may include memory structures, which are provided on the mat regions MTR, and vertical conductive structures VCS1, VCS2, and VCS3, which are provided in an insulating layer covering the memory structures.

For example, the horizontal layer 100 may be disposed on the lower insulating gapfill layer 50. The horizontal layer 100 may be disposed between an electrode structure ST and the peripheral circuit structure PS and may have a flat top surface, on which the electrode structure ST is formed. The horizontal layer 100 may be formed of or include at least one of semiconductor materials. The horizontal layer 100 may be formed of or include at least one of silicon (Si), germanium (Ge), silicon germanium (SiGe), gallium arsenic (GaAs), indium gallium arsenic (InGaAs), or aluminum gallium arsenic (AlGaAs). The horizontal layer 100 may include a polysilicon layer doped with n-type impurities. The horizontal layer 100 may be formed to have one of single-crystalline, poly-crystalline, and amorphous structures.

A source structure SC may be disposed between the electrode structure ST and the horizontal layer 100. The source structure SC may be extended parallel to the electrode structure ST or in the first and second directions D1 and D2. The source structure SC may include a first horizontal pattern SCP1 and a second horizontal pattern SCP2 on the first horizontal pattern SCP1. Each of the first and second horizontal patterns SCP1 and SCP2 may be formed of or include at least one of doped semiconductor materials. In each of the first and second horizontal patterns SCP1 and SCP2, the dopants may include, for example, phosphorus (P) or arsenic (As). In an example embodiment, the first horizontal pattern SCP1 may have a doping concentration that is higher than the second horizontal pattern SCP2.

The electrode structures ST may be disposed on the source structure SC. The electrode structures ST may be extended from a cell array region CAR to a connection region CNR. Each of the electrode structures ST may include insulating layers ILD and electrodes EL, which are alternately stacked in a third direction D3 perpendicular to the top surface of the substrate 10. The electrodes EL may be stacked to have a stepwise structure on the connection region CNR, which is located at an edge portion of each mat region MTR. In each electrode structure ST, lengths of the electrodes EL in the first direction D1 may decrease with increasing distance from the horizontal layer 100. Each of the electrode structures ST may have pads PAD, which are arranged in a stepwise shape on the connection region CNR. The pads PAD may be portions of the electrodes EL and may be exposed by another of the electrodes EL directly disposed thereon. Adjacent ones of the pads PAD may be placed at horizontal and vertical positions different from each other. The electrodes EL may be formed of or include at least one of conductive materials. The electrodes EL may be formed of or include at least one of, for example, semiconductor materials, metal silicides, metallic materials, or metal nitrides. The insulating layers ILD may be formed of or include silicon oxide.

Vertical channel structures VS may be provided on the cell array region CAR to penetrate the electrode structure ST. The vertical channel structures VS may penetrate the source structure SC and may be connected to the horizontal layer 100. The vertical channel structures VS may be arranged in a specific direction or in a zigzag shape, when viewed in a plan view. The vertical channel structures VS may be formed of or include at least one of semiconductor materials (e.g., silicon (Si) and germanium (Ge)). Further, the vertical channel structures VS may be formed of or include at least one of doped semiconductor materials and/or undoped or intrinsic semiconductor materials.

For example, referring to FIG. 9, the vertical channel structures VS may include a buried insulating pattern VI, a vertical semiconductor pattern VP, and a data storing layer SP. The data storing layer SP may include a tunnel insulating layer TL, a charge storing layer CIL, and a blocking insulating layer BIL. The data storing layer SP may be used as a data storing layer of a NAND FLASH memory device. The data storing layer SP may include two portions, which are vertically separated from each other by an undercut region UC. The undercut region UC may be filled with the first horizontal pattern SCP1.

Referring back to FIGS. 6 to 8, a planarization insulating layer 150 may be provided on the horizontal layer 100. The planarization insulating layer 150 may cover end portions (i.e., the pads PAD) of the electrodes EL forming a stepwise structure. The planarization insulating layer 150 may have a flat top surface. In an example embodiment, the top surface of the planarization insulating layer 150 may be coplanar with the top surface of the uppermost one of the insulating layers ILD of the electrode structure ST. The planarization insulating layer 150 may be formed of or include at least one of, for example, silicon oxide, silicon nitride, or silicon oxynitride. A first interlayer insulating layer 112 may be provided on the top surface of the planarization insulating layer 150. The first interlayer insulating layer 112 may cover top surfaces of the vertical channel structures VS.

Supporting structures DS may be formed on the connection region CNR. The supporting structures DS may be provided to penetrate the electrode structure ST (e.g., see FIG. 14). In an example embodiment, the supporting structures DS and the vertical channel structures VS may be formed through the same process. The supporting structures DS may have a structure similar to the vertical channel structures VS but may not be connected to the bit lines BL to be described below.

Separation structures SS1 and SS2 may be provided on each of the mat regions MTR. The separation structures SS1 and SS2 may be extended in the first direction D1. The separation structures SS1 and SS2 may be provided to cross the electrode structure ST in the first direction D1. The separation structures SS1 and SS2 may be extended in the third direction D3 to penetrate the first interlayer insulating layer 112, the planarization insulating layer 150, and the electrode structure ST. The electrodes EL may be spaced apart from each other in the second direction D2 by the separation structures SS1 and SS2. Top surfaces of the separation structures SS1 and SS2 may be located at the same level as a top surface of the first interlayer insulating layer 112. Bottom surfaces of the separation structures SS1 and SS2 may be located at a level lower than a bottom surface of the lowermost one of the electrodes EL. In an example embodiment, the bottom surfaces of the separation structures SS1 and SS2 may be in contact with the source structure SC. The separation structures SS1 and SS2 may be formed of or include at least one of insulating materials. For example, the separation structures SS1 and SS2 may be formed of or include at least one of silicon oxide, silicon nitride, or silicon oxynitride.

The separation structures SS1 and SS2 may include first separation structures SS1, which are provided to fully cross the electrode structure ST, and second separation structures SS2, which are provided to partially cross the electrode structure ST. In an example embodiment, the first separation structures SS1 and the second separation structures SS2 may be alternately disposed in the second direction D2.

An insulating separation pattern 115 may be formed in an upper portion of the electrode structure ST. The insulating separation pattern 115 may be provided on the cell array region CAR to extend in the first direction D1. The insulating separation pattern 115 may be aligned to the second separation structure SS2 on the connection region CNR in the first direction D1. The insulating separation pattern 115 may be provided to penetrate some of the electrodes EL provided at an upper level of the electrode structure ST. In other words, due to the insulating separation pattern 115, some of the electrodes EL provided at an upper level of the electrode structure ST may be separated from each other in the second direction D2. The insulating separation pattern 115 may overlap some of the vertical channel structures VS.

A second interlayer insulating layer 114 and a third interlayer insulating layer 116 may be sequentially stacked on the first interlayer insulating layer 112. The second interlayer insulating layer 114 and the third interlayer insulating layer 116 may be formed of or include, for example, silicon oxide. The second interlayer insulating layer 114 may cover the top surfaces of the separation structures SS1 and SS2.

The bit lines BL may be provided on the cell array region CAR. The bit lines BL may be disposed on the third interlayer insulating layer 116. The bit lines BL may be extended in the second direction D2 to cross the electrode structures ST. Each of the bit lines BL may be electrically connected to the vertical channel structures VS through bit line plugs BP. The bit line plugs BP may be provided to penetrate the first interlayer insulating layer 112, the second interlayer insulating layer 114, and the third interlayer insulating layer 116 and to connect the bit lines BL to the vertical channel structures VS.

Contact plugs CP may be provided on the connection region CNR. The contact plugs CP may be provided to penetrate the first interlayer insulating layer 112, the second interlayer insulating layer 114, and the planarization insulating layer 150 and may be coupled to the end portions (e.g., the pads PAD) of the electrodes EL. Lengths of the contact plugs CP may depend on heights of the pads PAD coupled thereto. The larger the distance from the cell array region CAR, the larger the lengths of the contact plugs CP. That is, vertical levels of bottom ends of the contact plugs CP may depend on the heights of the pads PAD coupled thereto.

Penetration vias TV may be provided on the penetration interconnection region THR. The penetration vias TV may be provided to penetrate the first interlayer insulating layer 112, the second interlayer insulating layer 114, the planarization insulating layer 150, the buried insulating pattern 102, and the lower insulating gapfill layer 50 and may be coupled to the landing pads LP. The penetration vias TV may have vertical lengths which are larger than the contact plugs CP. The penetration vias TV may be connected to the contact plugs CP, respectively, through upper interconnection lines CL, which are formed on the third interlayer insulating layer 116. In other words, the penetration vias TV may electrically connect the electrodes EL of the electrode structures ST to the peripheral logic circuits PTR.

The vertical conductive structures VCS1, VCS2, and VCS3 may be provided on the connection region CNR, the gap region GR, and the penetration interconnection region THR. At least some of the vertical conductive structures VCS1, VCS2, and VCS3 may be located between the contact plugs CP and the penetration vias TV. The vertical conductive structures VCS1, VCS2, and VCS3 may be surrounded by at least one insulating material and may be in an electrically-floated state. For example, the vertical conductive structures VCS1, VCS2, and VCS3 may include a plurality of conductive pillars, which are horizontally spaced apart from each other, and each of which is in an electrically-floated state. The conductive pillars may not be grounded. A voltage from an external power may not be applied to the conductive pillars. The conductive pillars may be electrically disconnected from each other.

The vertical conductive structures VCS1, VCS2, and VCS3 may have top surfaces which are located at a level that is higher than top surfaces of the separation structures SS1 and SS2 and is lower than bottom surfaces of the upper interconnection lines CL. The top surfaces of the vertical conductive structures VCS1, VCS2, and VCS3 may be located at the same level as a top surface of the second interlayer insulating layer 114. The top surfaces of the vertical conductive structures VCS1, VCS2, and VCS3 may be covered with the third interlayer insulating layer 116. The vertical conductive structures VCS1, VCS2, and VCS3 may be provided to penetrate the first interlayer insulating layer 112 and the second interlayer insulating layer 114 and may be extended into the planarization insulating layer 150. Some of the vertical conductive structures VCS1, VCS2, and VCS3 may have lower portions which are inserted in the planarization insulating layer 150. Others of the vertical conductive structures VCS1, VCS2, and VCS3 may penetrate the planarization insulating layer 150 and may be inserted in the lower insulating gapfill layer 50. Each of the vertical conductive structures VCS1, VCS2, and VCS3 may have a width decreasing with decreasing distance from the substrate 10.

The vertical conductive structures VCS1, VCS2, and VCS3 may include first vertical conductive structures VCS1 on the gap region GR, second vertical conductive structures VCS2 on the penetration interconnection region THR, and third vertical conductive structures VCS3 on the connection region CNR. The first vertical conductive structures VCS1 may have a length which is smaller than the second vertical conductive structures VCS2 and is larger than the third vertical conductive structures VCS3. Each of the first, second, and third vertical conductive structures VCS1, VCS2, and VCS3 may be referred to as a conductive pillar. The conductive pillars may be arranged to have a specific density on each region of the substrate 10, and in this case, it may be possible to more easily exhaust an impurity gas, which is formed in the planarization insulating layer 150 during a process of fabricating a semiconductor device. In an example embodiment, the impurity gas may include hydrogen gas. The numbers of the conductive pillars per unit area on the gap region GR, the penetration interconnection region THR, and the connection region CNR may be different from each other.

The vertical conductive structures VCS1, VCS2, and VCS3 will be described in more detail with reference to FIGS. 6 to 8 and 10. The first vertical conductive structures VCS1 may be positioned between the electrode structure ST and the penetration vias TV. The first vertical conductive structures VCS1 may be arranged on the gap region GR in the first and second directions D1 and D2. Some of the first vertical conductive structures VCS1 may be located between the separation structures SS1 and SS2, which are adjacent to each other in the first direction D1. Others of the first vertical conductive structures VCS1 may be located between the separation structures SS1 and SS2 and the penetration vias TV. The first vertical conductive structures VCS1 may be located on a top surface 100t of the horizontal layer 100.

At least some of the first vertical conductive structures VCS1 may vertically overlap the upper interconnection line CL connecting the contact plug CP to the penetration via TV, as shown in FIGS. 7 and 10. The first vertical conductive structures VCS1 may be electrically disconnected from the upper interconnection lines CL. The first vertical conductive structures VCS1 may have top surfaces VCS1t, which are located at a level lower than the bottom surfaces of the upper interconnection lines CL, and the bottom surfaces of the upper interconnection lines CL and the top surfaces VCS1t of the first vertical conductive structures VCS1 may be spaced apart from each other in the third direction D3 with the third interlayer insulating layer 116 interposed therebetween. The top surfaces VCSlt of the first vertical conductive structures VCS1 may be located at the same level as top surfaces CPt of the contact plugs CP and top surfaces TVt of the penetration vias TV.

Lengths of the first vertical conductive structures VCS1 in the third direction D3 may be shorter than the penetration vias TV. The first vertical conductive structures VCS1 may have a length, which is longer than the longest one of the contact plugs CP, when measured in the third direction D3. For example, the first vertical conductive structures VCS1 may have a length, which is longer than the contact plug CP that is connected to the lowermost one of the electrodes EL or is closest to the penetration vias TV, when measured in the third direction D3.

The first vertical conductive structures VCS1 may have bottom surfaces VCS1b, which are located at a level higher than the top surface 100t of the horizontal layer 100. The bottom surfaces VCS1b of the first vertical conductive structures VCS1 may be located at a level lower than bottom ends CPb of the contact plugs CP. A region between the bottom surfaces VCS1b of the first vertical conductive structures VCS1 and the top surface 100t of the horizontal layer 100 may be filled with the planarization insulating layer 150. The bottom surfaces VCS1b of the first vertical conductive structures VCS1 may be covered with the planarization insulating layer 150. In other words, lower portions of the first vertical conductive structures VCS1 may be buried or inserted in the planarization insulating layer 150. The bottom surfaces VCS1b of the first vertical conductive structures VCS1 may be adjacent to the top surface 100t of the horizontal layer 100. For example, a distance between the bottom surfaces VCS1b of the first vertical conductive structures VCS1 and the top surface 100t of the horizontal layer 100 may be smaller than a thickness of the horizontal layer 100. The bottom surfaces VCS1b of the first vertical conductive structures VCS1 may be located at a level lower than the bottom surface of the lowermost one of the electrodes EL. The bottom surfaces VCS1b of the first vertical conductive structures VCS1 may be positioned at a level between top and bottom surfaces of the source structure SC. Widths of the bottom surfaces VCS1b of the first vertical conductive structures VCS1 may be smaller than widths of the top surfaces VCS It of the first vertical conductive structures VCS1.

The second vertical conductive structures VCS2 may be positioned between the penetration vias TV. The second vertical conductive structures VCS2 may be arranged on the penetration interconnection region THR and in the first and second directions D1 and D2. The second vertical conductive structures VCS2 may be positioned between a pair of the penetration vias TV, which are adjacent to each other in the first direction D1. For example, a pair of the second vertical conductive structures VCS2 may be disposed between the pair of the penetration vias TV, which are adjacent to each other in the first direction D1. The second vertical conductive structures VCS2 may vertically overlap the buried insulating pattern 102.

The second vertical conductive structures VCS2 may have bottom surfaces VCS2b which are located at a level lower than a bottom surface 100b of the horizontal layer 100. The second vertical conductive structures VCS2 may be provided to penetrate the buried insulating pattern 102, and the bottom surfaces VCS2b of the second vertical conductive structures VCS2 may be spaced apart from a bottom surface of the buried insulating pattern 102. The second vertical conductive structures VCS2 may be lower portions which are buried or inserted in the lower insulating gapfill layer 50. The bottom surface VCS2b of the second vertical conductive structures VCS2 may be covered with the third lower layer 53. Some of the second vertical conductive structures VCS2 may vertically overlap the landing pads LP. The bottom surface VCS2b of the second vertical conductive structure VCS2, which overlaps the landing pad LP, may be adjacent to a top surface LPt of the landing pad LP. For example, the bottom surface VCS2b of the second vertical conductive structure VCS2 overlapping the landing pad LP may be located at a vertical level, which is closer to the top surface LPt of the landing pad LP than to a bottom surface 100b of the horizontal layer 100. The bottom surface VCS2b of the second vertical conductive structures VCS2 may be located at a level which is higher than a top surface of the second lower layer 52.

At least one of the second vertical conductive structures VCS2 may vertically overlap the upper interconnection line CL on the penetration interconnection region THR, as shown in FIGS. 7 and 10. The second vertical conductive structures VCS2 may be electrically disconnected from the upper interconnection lines CL. The second vertical conductive structures VCS2 may have top surfaces VCS2t, which are located at a level lower than the bottom surfaces of the upper interconnection lines CL, and the bottom surface of the upper interconnection lines CL and the top surfaces VCS2t of the second vertical conductive structures VCS2 may be spaced apart from each other in the third direction D3 with the third interlayer insulating layer 116 interposed therebetween. The top surfaces VCS2t of the second vertical conductive structures VCS2 may be located at the same level as the top surfaces CPt of the contact plugs CP and the top surfaces TVt of the penetration vias TV. Widths of the top surfaces VCS2t of the second vertical conductive structures VCS2 may be larger than widths of the bottom surfaces VCS2b of the second vertical conductive structures VCS2.

The second vertical conductive structures VCS2 may have a length, which is longer than the first vertical conductive structures VCS1 and is shorter than the penetration vias TV, when measured in the third direction D3. The second vertical conductive structures VCS2 may have a length, which is longer than the longest one of the contact plugs CP, when measured in the third direction D3. For example, the second vertical conductive structures VCS2 may have a length, which is longer than the contact plug CP that is connected to the lowermost one of the electrodes EL or is closest to the penetration vias TV, when measured in the third direction D3.

The third vertical conductive structures VCS3 may be arranged on the connection region CNR in the first and second directions D1 and D2. The third vertical conductive structures VCS3 may vertically overlap the pads PAD. At least one of the third vertical conductive structures VCS3 may vertically overlap two adjacent ones of the pads PAD. For example, one of the third vertical conductive structures VCS3 may vertically overlap a pair of the pads PAD, which are adjacent to each other in the first direction D1. One of the third vertical conductive structures VCS3 may vertically overlap a side surface ELs of the electrode EL oriented in the first direction D1. For example, one of the third vertical conductive structures VCS3 may vertically overlap the side surfaces ELs of the electrodes EL oriented in the first direction D1. The third vertical conductive structures VCS3 may be located between the contact plugs CP. The third vertical conductive structures VCS3 may be located between a pair of the contact plugs CP, which are adjacent to each other in the first direction D1. For example, one of the third vertical conductive structures VCS3 may be disposed between the contact plugs CP, which are adjacent to each other in the first direction D1. The third vertical conductive structures VCS3 may have a length which is shorter than the pair of the contact plugs CP adjacent to each other in the first direction D1.

The third vertical conductive structures VCS3 may have bottom surfaces VCS3b, which are located at a level higher than the top surface of each of the pads PAD vertically overlapping the third vertical conductive structures VCS3. In the case where the third vertical conductive structure VCS3 vertically overlaps a pair of the pads PAD, the bottom surface VCS3b of the third vertical conductive structure VCS3 may be located at a level higher than a top surface of a higher one of the pair of the pads PAD. In other words, the third vertical conductive structures VCS3 may be spaced apart from the pads PAD in the third direction D3 and may be electrically disconnected from the pads PAD. Regions between the third vertical conductive structures VCS3 and the pads PAD may be filled with the planarization insulating layer 150. The bottom surfaces VCS3b of the third vertical conductive structures VCS3 may be covered with the planarization insulating layer 150. In other words, lower portions of the third vertical conductive structures VCS3 may be buried or inserted in the planarization insulating layer 150. At least one of the third vertical conductive structures VCS3 may have the bottom surface VCS3b located at a level lower than the bottom ends CPb of some contact plugs CP. For example, the bottom surface VCS3b of the third vertical conductive structure VCS3, which is closest to the penetration interconnection region THR, may be located at a level that is lower than the bottom end CPb of the contact plug CP coupled to the highest one of the pads PAD.

The third vertical conductive structures VCS3 may be electrically disconnected from the upper interconnection lines CL. The third vertical conductive structures VCS3 may have top surfaces VCS3t which are located at a level lower than the bottom surface of the upper interconnection lines CL. The top surfaces VCS3t of the third vertical conductive structures VCS3 may be located at the same level as the top surfaces CPt of the contact plugs CP and the top surfaces TVt of the penetration vias TV. Widths of the top surfaces VCS3t of the third vertical conductive structures VCS3 may be larger than widths of the bottom surfaces VCS3b of the third vertical conductive structures VCS3.

Figure 11A:
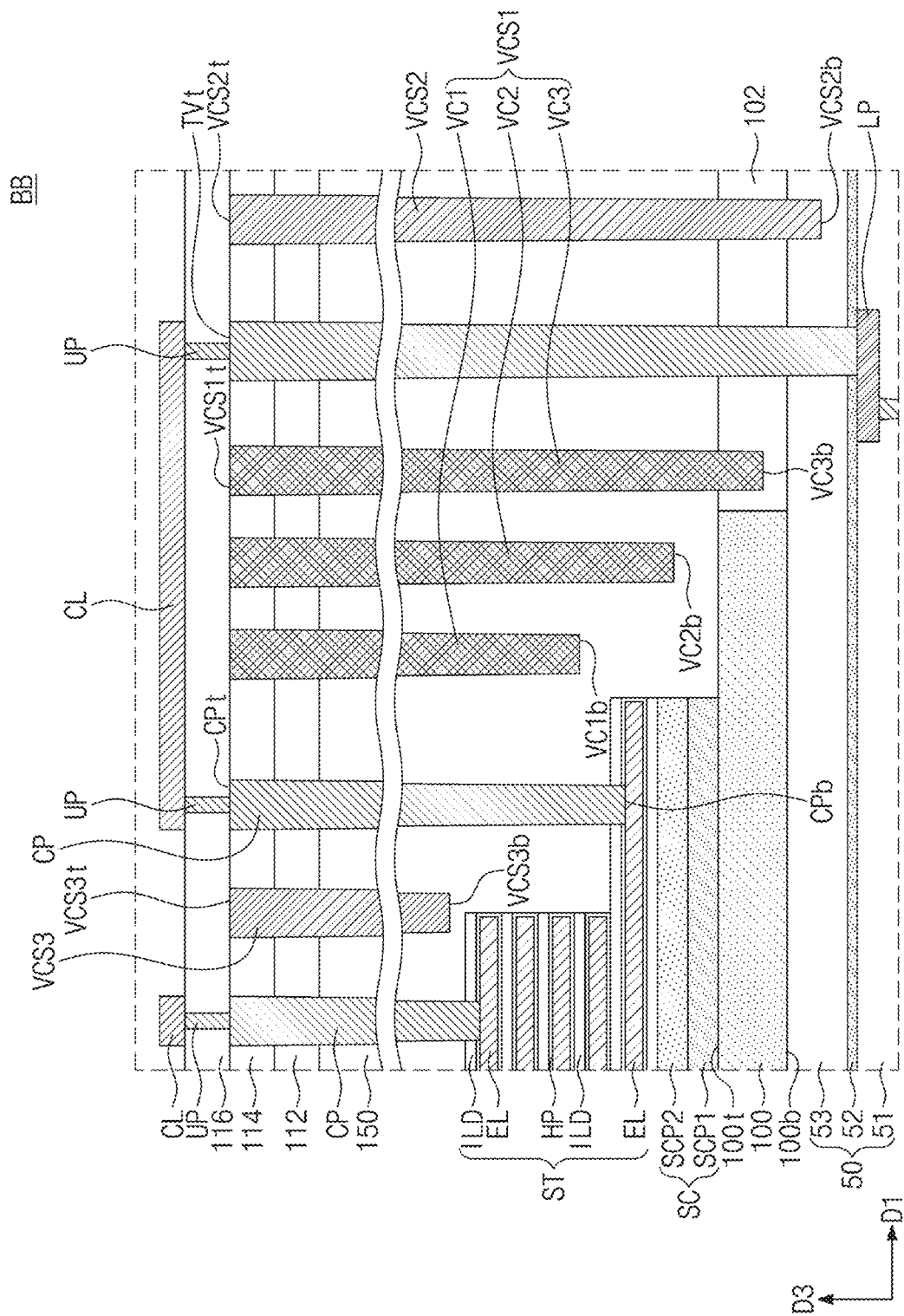
FIGS. 11A, 11B, and 11C are enlarged sectional views, each of which illustrate a semiconductor device according to an example embodiment of the inventive concept and corresponds to the portion 'BB' of FIG. 7.
Figure 11B:
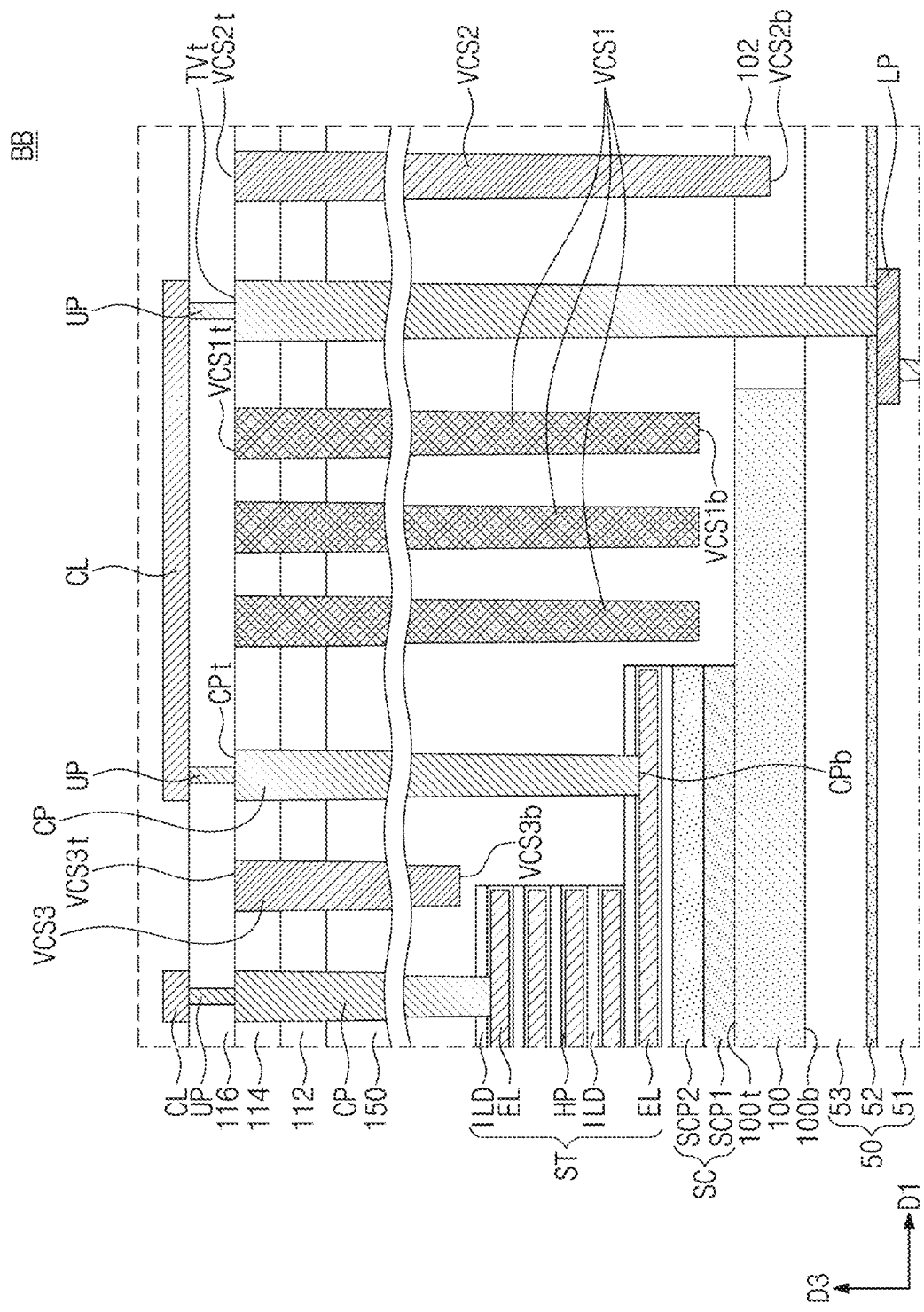
Figure 11C:
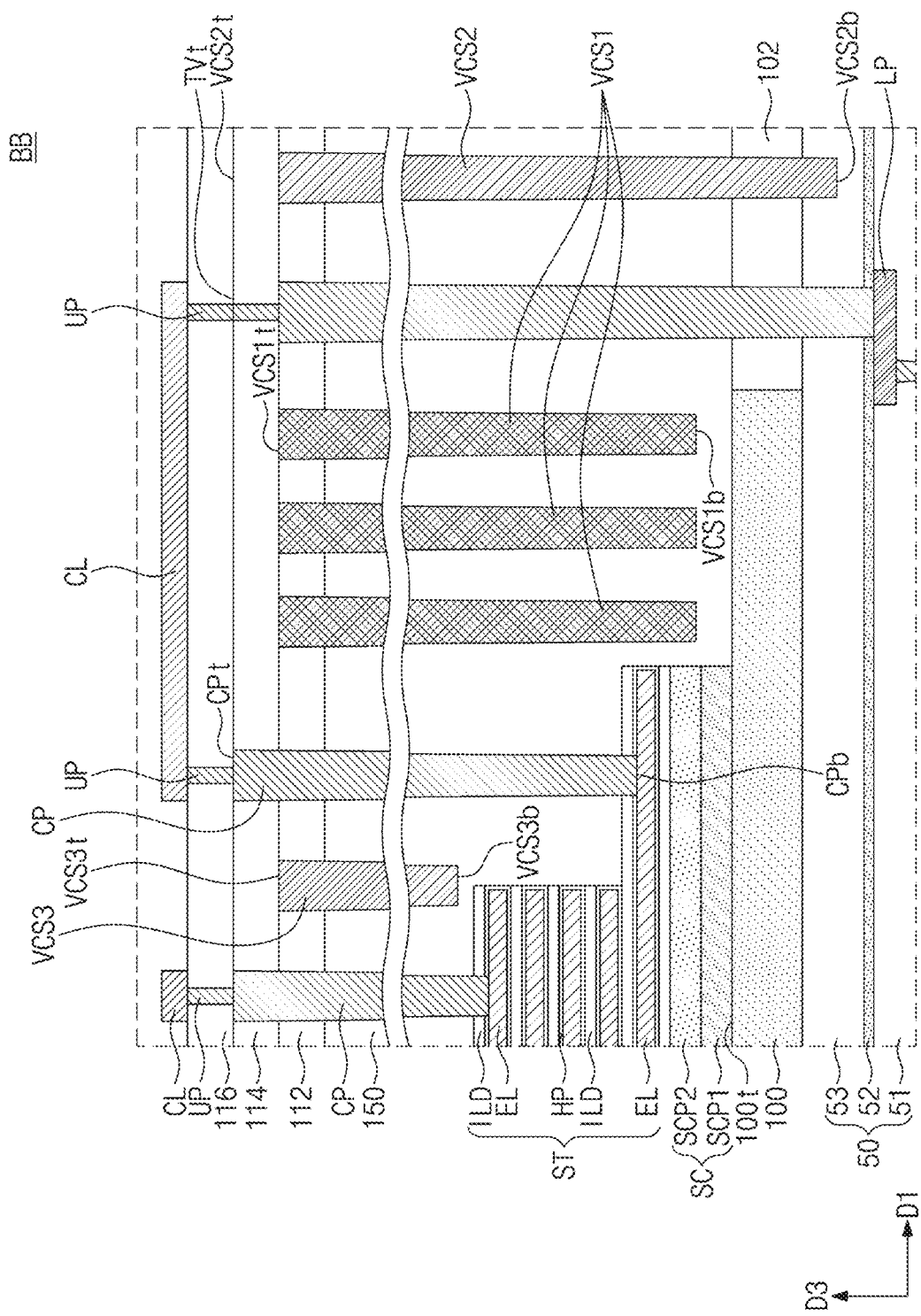

FIGS. 11A, 11B, and 11C are enlarged sectional views, each of which illustrate a semiconductor device according to an example embodiment of the inventive concepts and corresponds to the portion 'BB' of FIG. 7.

Referring to FIG. 11A, the first vertical conductive structures VCS1 may include a first conductive pillar VC1, a second conductive pillar VC2, and a third conductive pillar VC3 which have different lengths in the third direction D3. Because the first vertical conductive structures VCS1 have different lengths from each other, it may be possible to improve reliability in an electric separation property between the first vertical conductive structures VCS1 and elements provided therebelow.

In an example embodiment, the first conductive pillar VC1, the second conductive pillar VC2, and the third conductive pillar VC3 may have top surfaces which are located at the same level. A bottom surface VC2b of the second conductive pillar VC2 may be located at a level that is lower than a bottom surface VC1b of the first conductive pillar VC1 and is higher than a bottom surface VC3b of the third conductive pillar VC3. The bottom surface VC1b of the first conductive pillar VC1 may be located at a level higher than the top surface of the lowermost one of the electrodes EL. The bottom surface VC2b of the second conductive pillar VC2 may be located at a vertical level between the top and bottom surfaces of the source structure SC. The bottom surface VC3b of the third conductive pillar VC3 may be located at a level lower than the top surface 100t of the horizontal layer 100. For example, the bottom surface VC3b of the third conductive pillar VC3 may be located at a vertical level between the top surface 100t of the horizontal layer 100 and the bottom surface 100b of the horizontal layer 100. A lower portion of the third conductive pillar VC3 may be buried in the buried insulating pattern 102. The bottom surface VC3b of the third conductive pillar VC3 may be covered with the buried insulating pattern 102. In an example embodiment, the first vertical conductive structures VCS1 may have lengths increasing with decreasing distance from the penetration vias TV.

Referring to FIG. 11B, the second vertical conductive structure VCS2 may have the bottom surface VCS2b located at a level higher than the bottom surface 100b of the horizontal layer 100. Because the second vertical conductive structure VCS2 has a reduced length, it may be possible to mitigate or prevent the second vertical conductive structures VCS2 from leaning. Further, it may be possible to improve reliability in an electric separation property between the second vertical conductive structures VCS2 and the landing pads LP. In an example embodiment, the bottom surface VCS2b of the second vertical conductive structure VCS2 may be located at a vertical level between the top surface 100t of the horizontal layer 100 and the bottom surface 100b of the horizontal layer 100. The bottom surface VCS2b of the second vertical conductive structure VCS2 may be covered with the buried insulating pattern 102. That is, a lower portion of the second vertical conductive structure VCS2 may be buried or inserted in the buried insulating pattern 102.

Referring to FIG. 11C, the top surfaces VCS1t, VCS2t, and VCS3t of the vertical conductive structures VCS1, VCS2, and VCS3 may be located at a level lower than the top surfaces CPt of the contact plugs CP. The top surfaces VCS1t, VCS2t, and VCS3t of the vertical conductive structures VCS1, VCS2, and VCS3 may be covered with the second interlayer insulating layer 114. The top surfaces VCS1t, VCS2t, and VCS3t of the vertical conductive structures VCS1, VCS2, and VCS3 may be located at the same level as the top surface of the first interlayer insulating layer 112. A length of an upper plug UP connecting the contact plug CP to the upper interconnection line CL may be shorter than a length of the upper plug UP connecting the penetration via TV to the upper interconnection line CL.

Figure 12A:
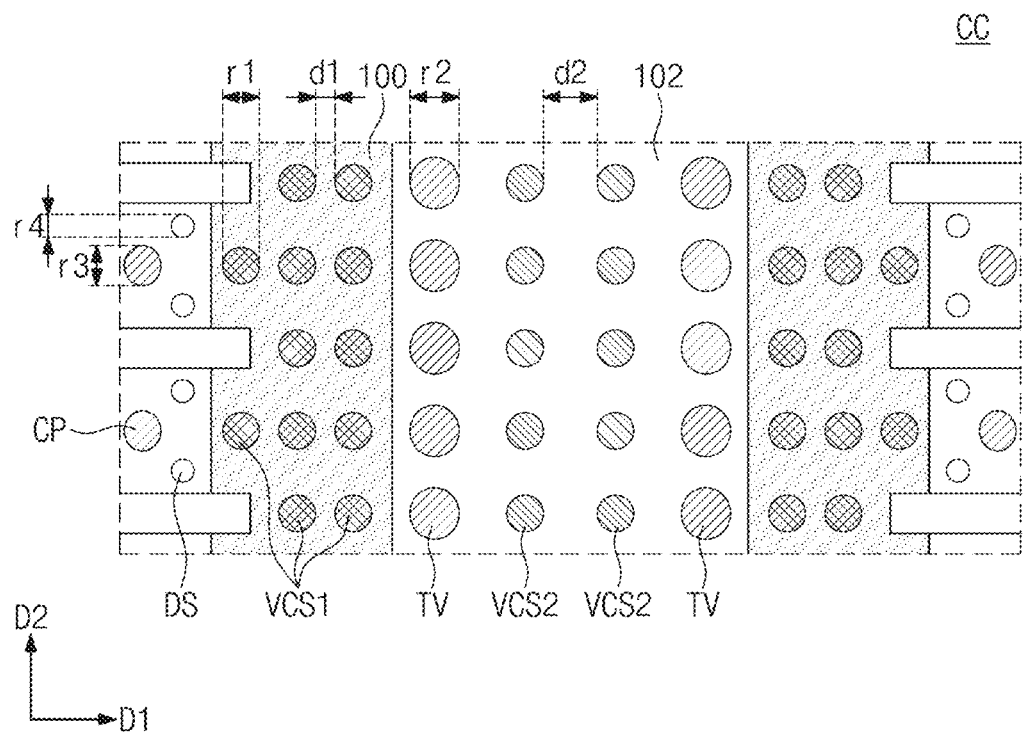
FIGS. 12A and 12B are enlarged plan views, each of which illustrates a semiconductor device according to an example embodiment of the inventive concepts and corresponds to a portion 'CC' of FIG. 6.
Figure 12B:
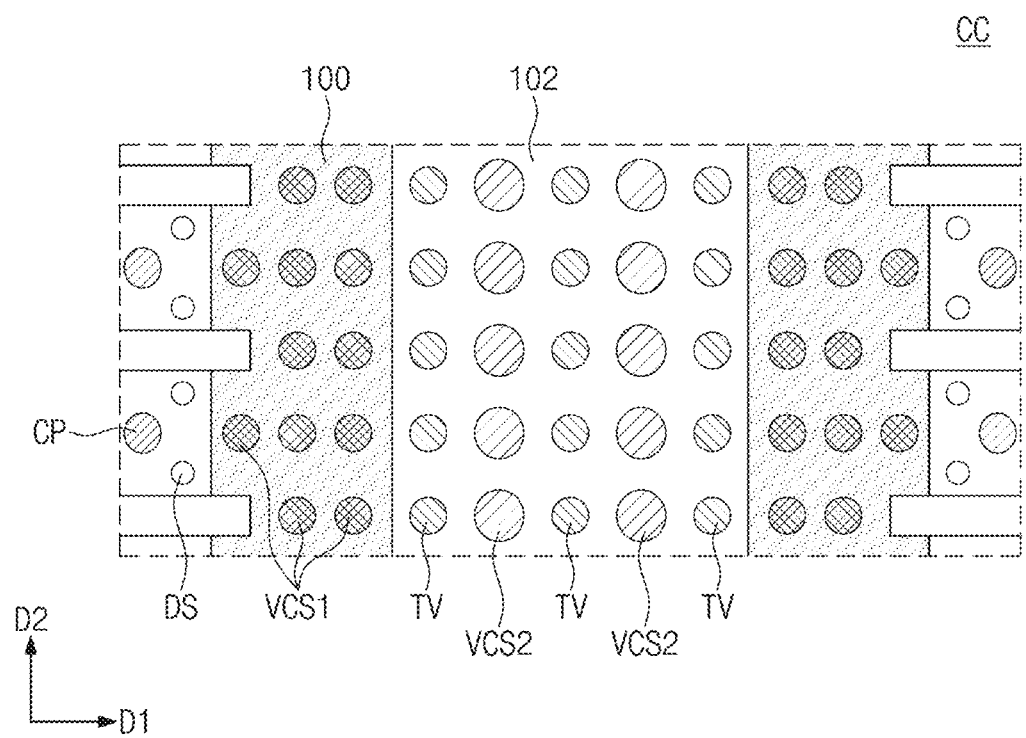

FIGS. 12A and 12B are enlarged plan views, each of which illustrates a semiconductor device according to an example embodiment of the inventive concepts and corresponds to a portion 'CC' of FIG. 6.

Referring to FIGS. 6 and 12A, a distance d1 between adjacent ones of the first vertical conductive structures VCS1 in the first direction D1 may be smaller than a distance d2 between adjacent ones of the second vertical conductive structures VCS2 in the first direction D1. The first vertical conductive structures VCS1 may be arranged to have a density that is higher than that of the second vertical conductive structures VCS2, when viewed in a plan view. For example, the number of the first vertical conductive structures VCS1 per unit area on the gap region GR may be greater than the number of the second vertical conductive structures VCS2 per unit area on the penetration interconnection region THR.

In an example embodiment, diameters r1 of the vertical conductive structures VCS1, VCS2, and VCS3 may be smaller than diameters r2 of the penetration vias TV and diameters r3 of the contact plugs CP. The diameters r1 of the vertical conductive structures VCS1, VCS2, and VCS3 may be larger than diameters r4 of the supporting structures DS.

Referring to FIG. 12B, the second vertical conductive structures VCS2 may be disposed between the penetration vias TV, which are adjacent to each other in the second direction D2. In an example embodiment, the second vertical conductive structures VCS2 may be arranged to surround the penetration vias TV when viewed in a plan view. In an example embodiment, the penetration vias TV and the second vertical conductive structures VCS2 may be alternately arranged in the first and second directions D1 and D2.

Figure 13:
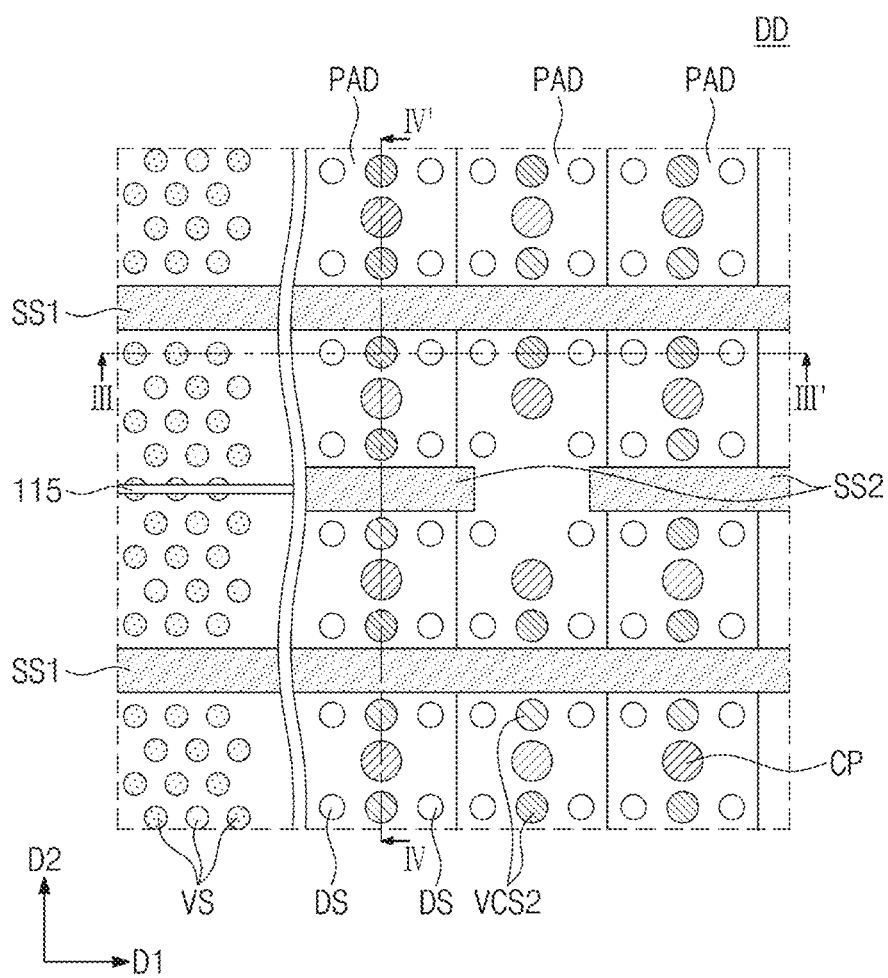
FIG. 13 is an enlarged plan view illustrating a semiconductor device according to an example embodiment of the inventive concepts and corresponding to a portion 'DD' of FIG. 6.
Figure 14:
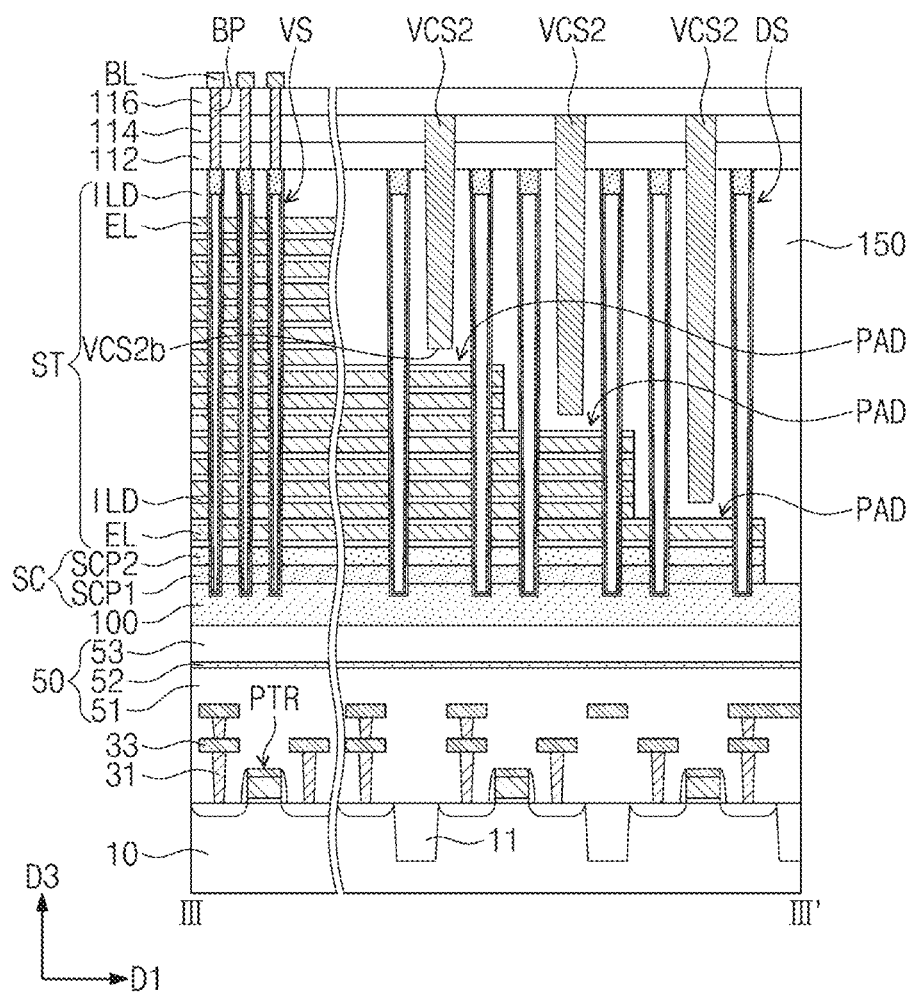
FIGS. 14 and 15 are sectional views taken along lines and IV-IV' of FIG. 13.
Figure 15:
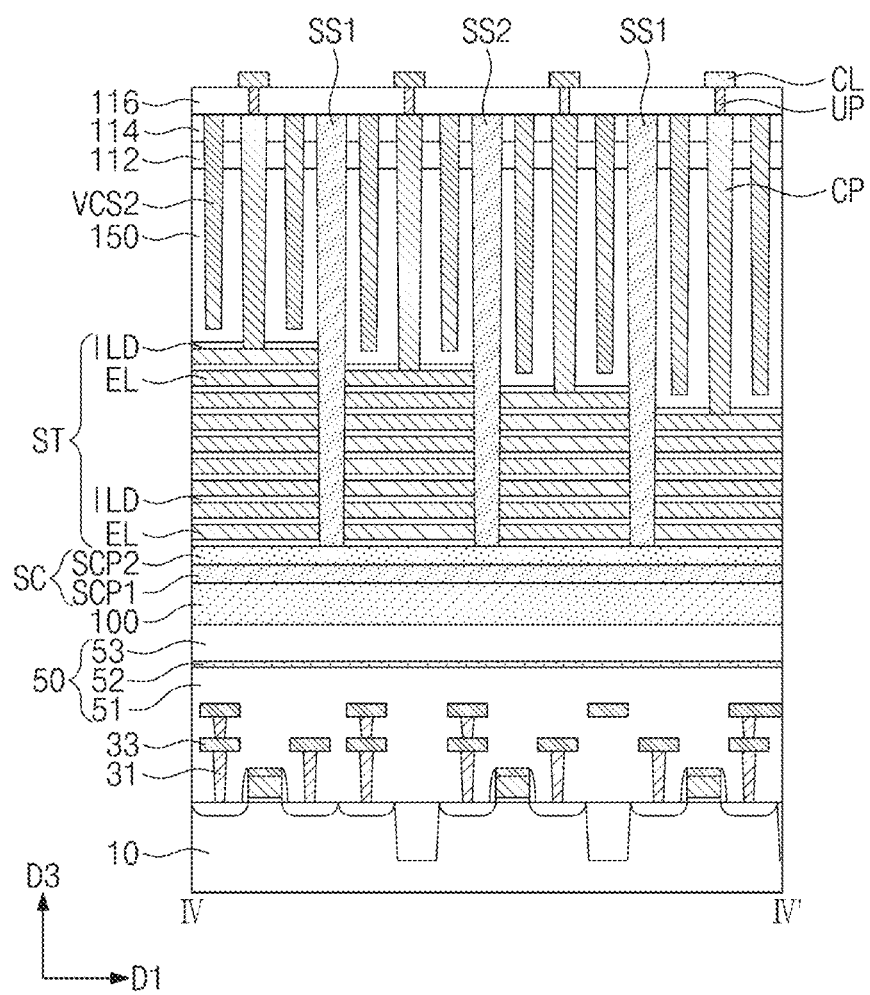

FIG. 13 is an enlarged plan view illustrating a semiconductor device according to an example embodiment of the inventive concepts and corresponding to a portion 'DD' of FIG. 6. FIGS. 14 and 15 are sectional views taken along lines and IV-IV' of FIG. 13.

Referring to FIGS. 13 to 15, the second vertical conductive structures VCS2 may be disposed between the supporting structures DS, which are adjacent to each other in the first direction D1. Further, the second vertical conductive structures VCS2 may be disposed between the contact plugs CP, which are adjacent to each other in the second direction D2.

For example, the second vertical conductive structures VCS2 may be disposed between the supporting structures DS, which are provided to penetrate one of the pads PAD and are spaced apart from each other in the first direction D1. The second vertical conductive structures VCS2 may have bottom surfaces located at a level higher than the top surface of the one of the pads PAD.

A pair of the second vertical conductive structures VCS2, which are spaced apart from each other in the second direction D2, may be disposed on one of the pads PAD. The contact plug CP coupled to the one of the pads PAD may be disposed between a pair of the second vertical conductive structures VCS2, which are spaced apart from each other in the second direction D2.

Figure 16:
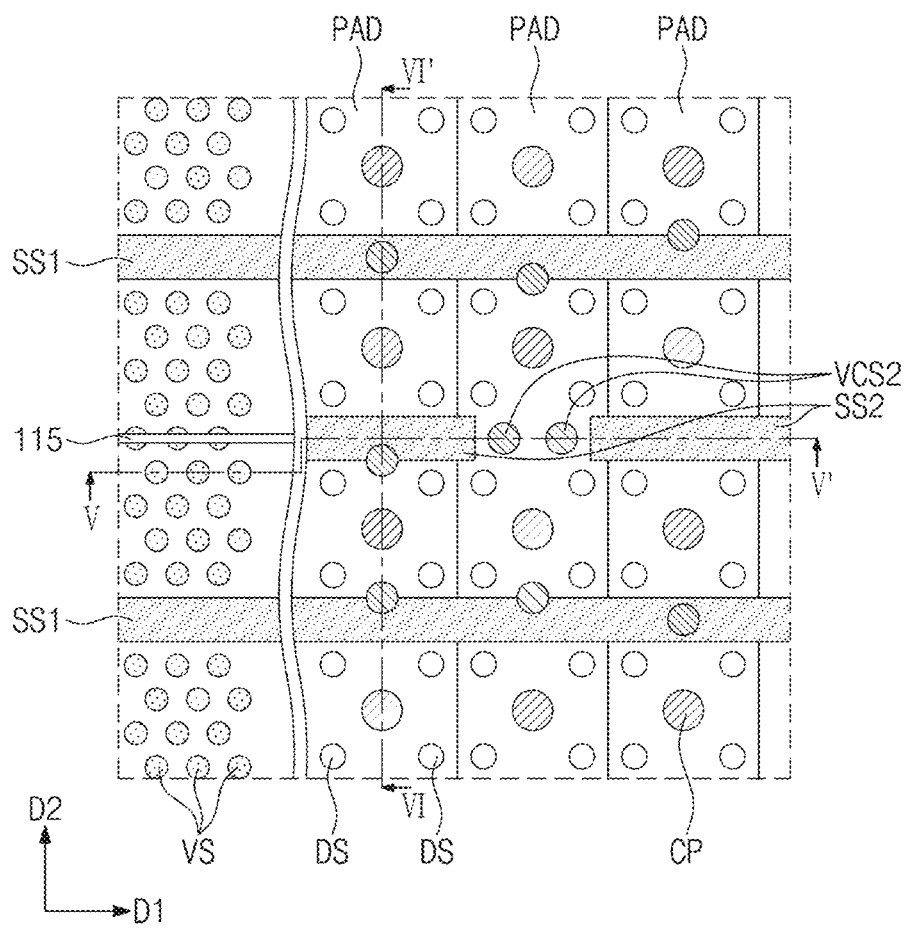
FIG. 16 is an enlarged plan view illustrating a semiconductor device according to an example embodiment of the inventive concepts and corresponding to the portion 'DD' of FIG. 6.
Figure 17:
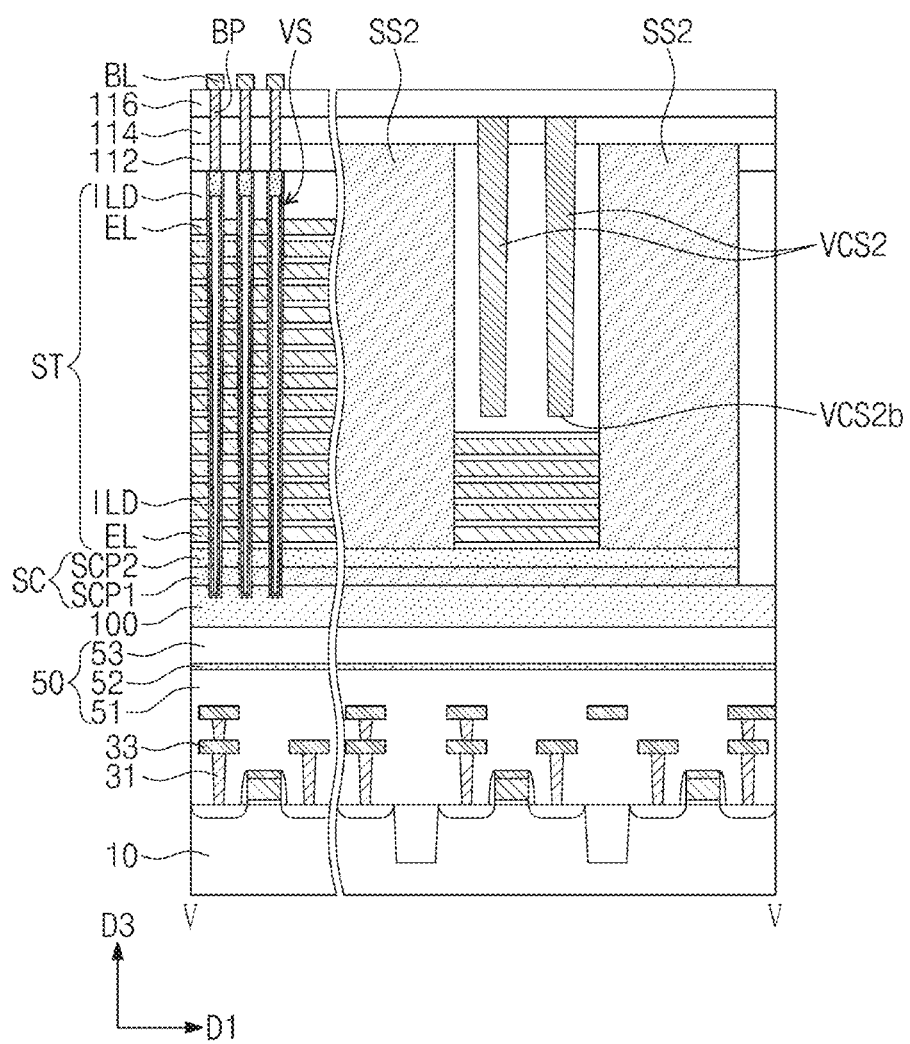
FIGS. 17 and 18 are sectional views taken along lines and IV-IV' of FIG. 13.
Figure 18:
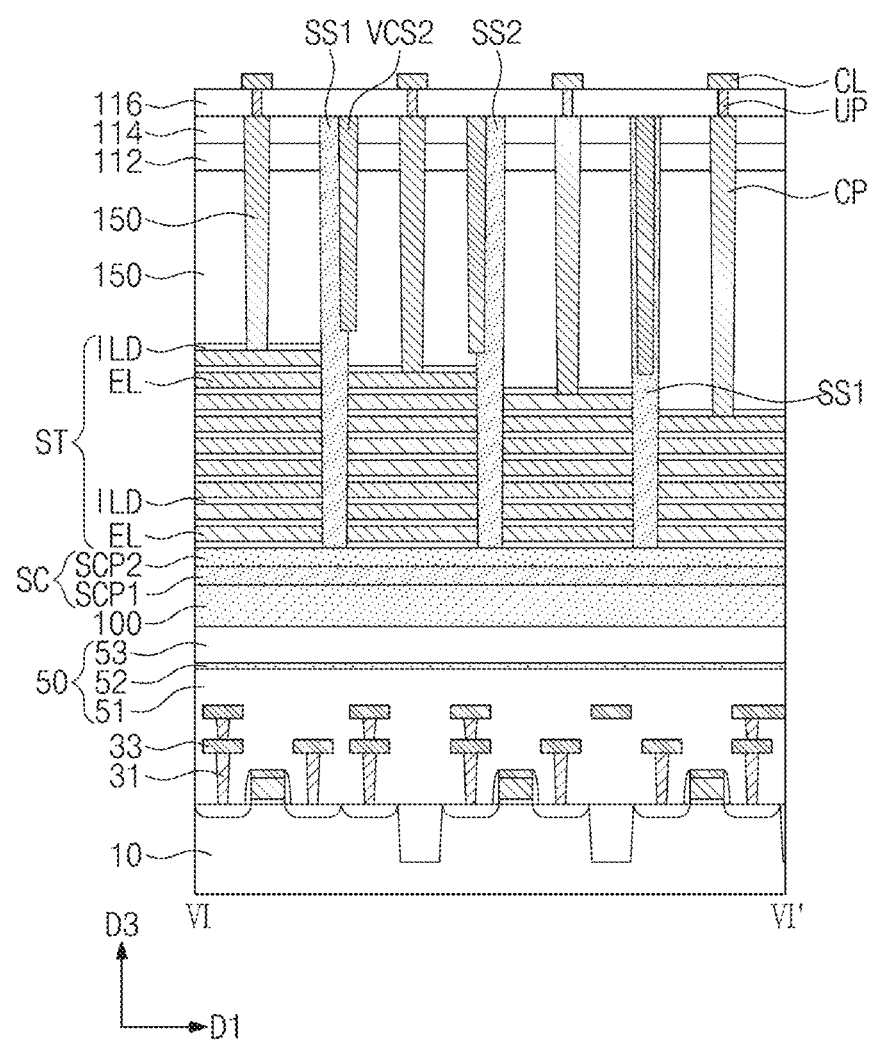

FIG. 16 is an enlarged plan view illustrating a semiconductor device according to an example embodiment of the inventive concepts and corresponding to the portion 'DD' of FIG. 6. FIGS. 17 and 18 are sectional views taken along lines and IV-IV' of FIG. 13.

Referring to FIGS. 16 to 18, at least some of the second vertical conductive structures VCS2 may vertically overlap the separation structures SS1 and SS2. The second vertical conductive structures VCS2 may be partially or fully overlapped with the separation structures SS1 and SS2, when viewed in a plan view.

At least some of the second vertical conductive structures VCS2 may be located between the second separation structures SS2. For example, the second separation structures SS2 may be spaced apart from each other in the first direction D1, and the second vertical conductive structures VCS2 may be located on the electrodes EL between the second separation structures SS2. The second vertical conductive structures VCS2 may have bottom surfaces VCS2b, which are spaced apart from the top surfaces of the electrodes EL between the second separation structures SS2 in the third direction D3.

Figure 19:
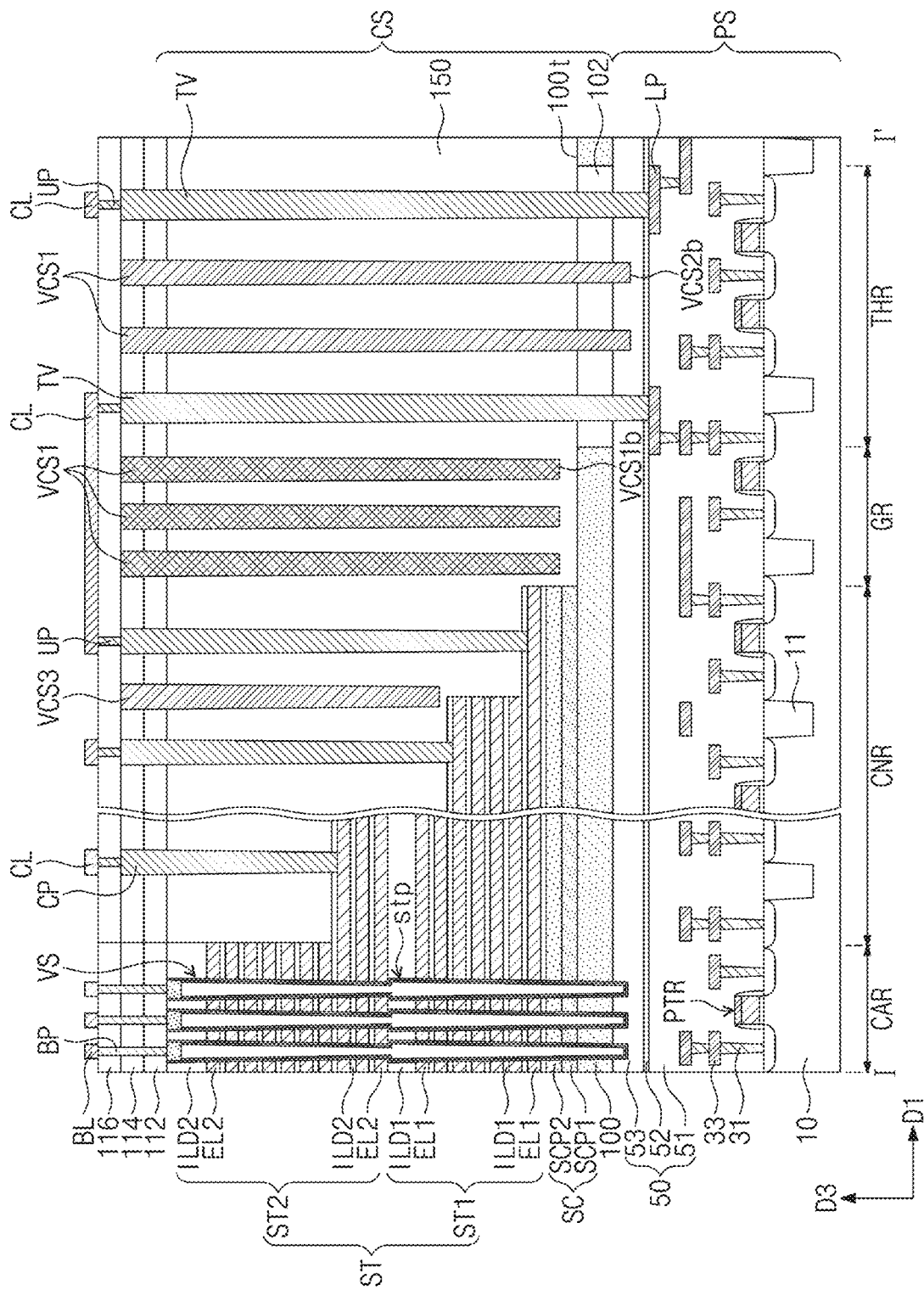
FIG. 19 is a sectional view illustrating a semiconductor device according to an example embodiment of the inventive concepts, taken along the line I-I' of FIG. 6.

FIG. 19 is a sectional view illustrating a semiconductor device according to an example embodiment of the inventive concepts, taken along the line I-I' of FIG. 6. For concise description, a previously described element may be identified by the same reference number without repeating an overlapping description thereof.

Referring to FIG. 19, the electrode structure ST may include a lower electrode structure ST1 and an upper electrode structure ST2 on the lower electrode structure ST1. The lower electrode structure ST1 may include first insulating layers ILD1 and first electrodes EL1, which are alternately stacked in the third direction D3. The upper electrode structure ST2 may include second insulating layers ILD2 and second electrodes EL2, which are alternately stacked in the third direction D3. The uppermost one of the second insulating layers ILD2 of the upper electrode structure ST2 may be thicker than the first insulating layers ILD1 and the others of the second insulating layers ILD2 placed therebelow. One of the first insulating layers ILD1, which is located between the uppermost electrode EL1 of the lower electrode structure ST1 and the lowermost electrode EL2 of the upper electrode structure ST2, may be thicker than others of the first insulating layers ILD1 placed therebelow.

The vertical channel structures VS may be provided on the cell array region CAR to penetrate the upper electrode structure ST2 and the lower electrode structure ST1. The vertical channel structures VS may have a diameter decreasing from the top surface of the upper electrode structure ST2 to the bottom surface of the upper electrode structure ST2. The vertical channel structures VS may have a diameter decreasing from the top surface of the lower electrode structure ST1 (i.e., the top surface of the uppermost first insulating layer ILD1) to the bottom surface of the lower electrode structure ST1. Each of the vertical channel structures VS may have a height-difference portion stp whose diameter is discontinuously changed near a boundary between the lower and upper electrode structures ST1 and ST2. The bottom surfaces VCS1b of the first vertical conductive structures VCS1 and the bottom surfaces VCS2b of the second vertical conductive structures VCS2 may be located at a level that is lower than the top surface of the lower electrode structure ST1 and the height-difference portions stp of the vertical channel structures VS.

Hereinafter, a method of fabricating a semiconductor device according to an example embodiment of the inventive concepts will be described in more detail with reference to the accompanying drawings.

Figure 24:
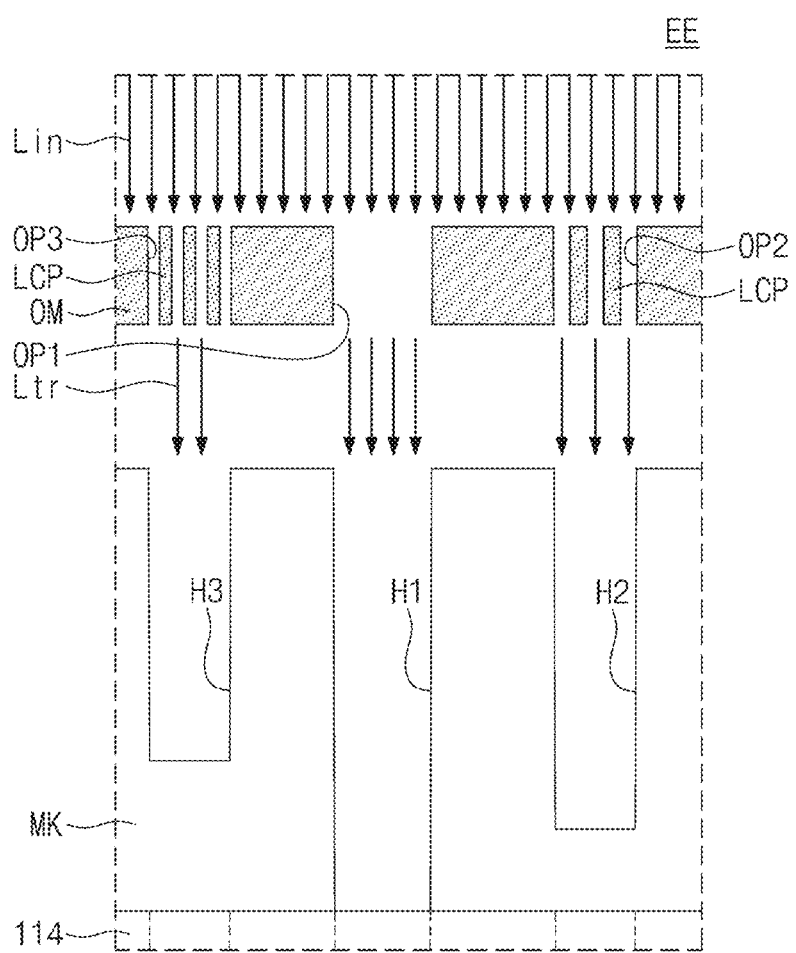
FIG. 24 is a diagram illustrating a method of fabricating a semiconductor device according to an example embodiment of the inventive concepts and corresponding to a portion 'EE' of FIG. 23.
Figure 25:
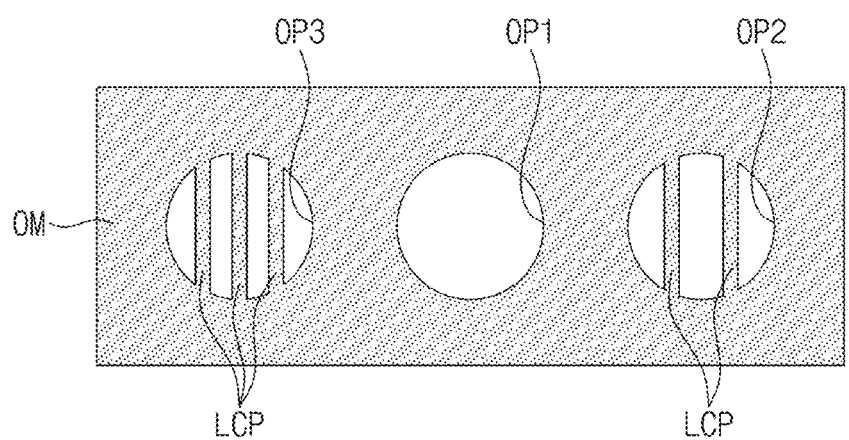
FIG. 25 is a plan view illustrating a portion of an optical mask according to an example embodiment of the inventive concepts.

FIGS. 20, 21, 22, 23, 26, and 27 are sectional views illustrating a method of fabricating a semiconductor device according to an example embodiment of the inventive concepts, taken along the line I-I' of FIG. 6. FIG. 24 is a diagram illustrating a method of fabricating a semiconductor device according to an example embodiment of the inventive concepts and corresponding to a portion 'EE' of FIG. 23. FIG. 25 is a plan view illustrating a portion of an optical mask according to an example embodiment of the inventive concepts.

Figure 20:
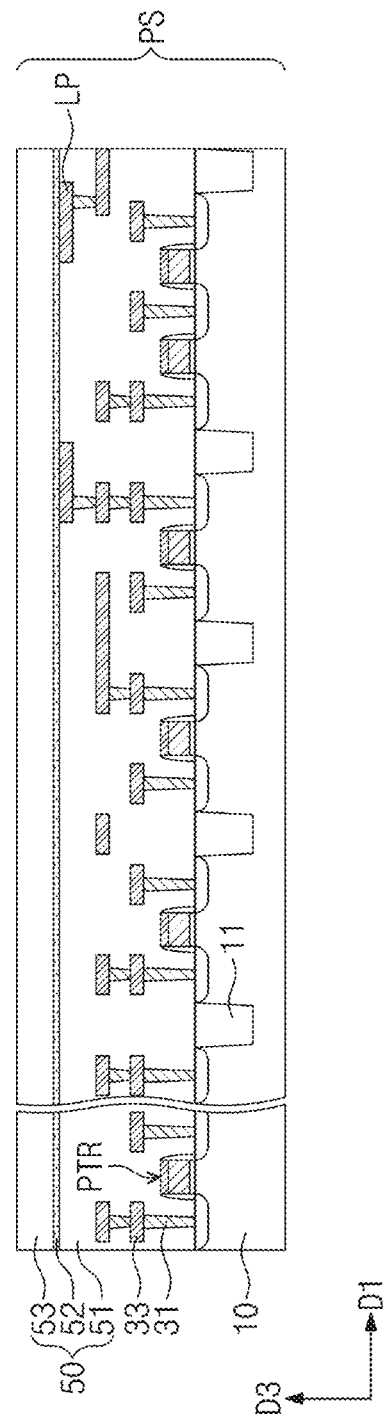
FIGS. 20, 21, 22, 23, 26, and 27 are sectional views illustrating a method of fabricating a semiconductor device according to an example embodiment of the inventive concepts, taken along the line I-I' of FIG. 6.

Referring to FIG. 20, the peripheral circuit structure PS including the peripheral logic circuits PTR on the substrate 10 may be formed. In an example embodiment, the peripheral logic circuits PTR may include row and column decoders, page buffers, and control circuits, which are formed on the substrate 10. For example, the formation of the peripheral logic circuits PTR may include forming the device isolation layer 11 in the substrate 10 to define active regions, sequentially forming a peripheral gate insulating layer and a peripheral gate electrode on the substrate 10, and injecting impurities into portions of the substrate 10 at both sides of the peripheral gate electrode to form source/drain regions. Peripheral gate spacers may be formed on side surfaces of the peripheral gate electrode.

The peripheral contact plugs 31, the peripheral circuit interconnection lines 33, and the landing pads LP may be formed in the lower insulating gapfill layer 50. In an example embodiment, the landing pads LP may be electrically connected to the peripheral logic circuits PTR constituting the row decoder of the peripheral logic circuits PTR.

Figure 21:
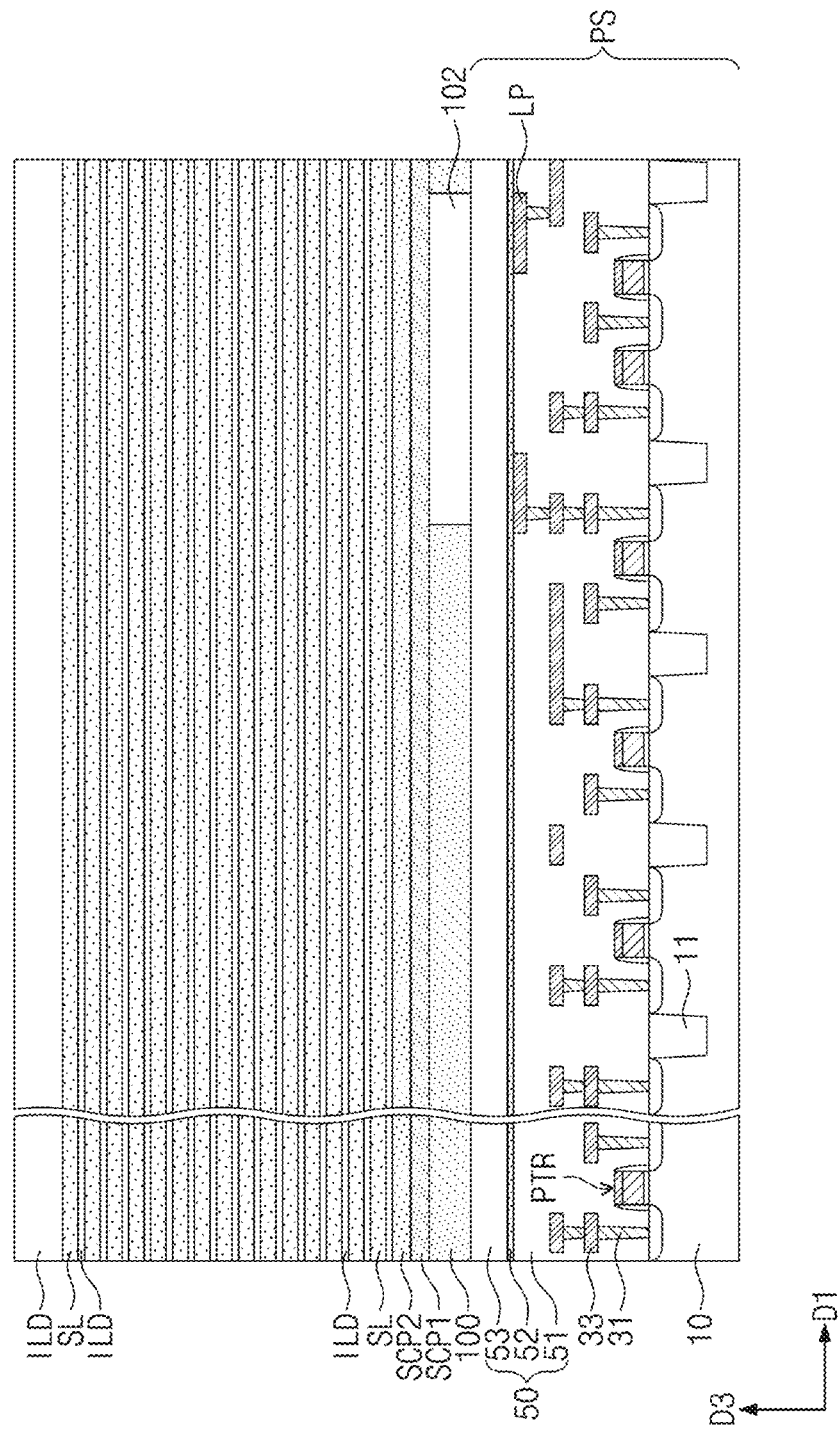

Referring to FIG. 21, the horizontal layer 100 and the buried insulating pattern 102 may be formed on the peripheral circuit structure PS. The horizontal layer 100 may be formed using a deposition process. For example, the formation of the horizontal layer 100 may include depositing a poly-silicon layer to cover the entire top surface of the substrate 10. Thereafter, a patterning process and a deposition process may be performed to form the buried insulating pattern 102 partially penetrating the horizontal layer 100.

A first preliminary source layer SCL1 and a second preliminary source layer SCL2 may be deposited on the horizontal layer 100 and the buried insulating pattern 102. In an example embodiment, during the process of depositing the first and second preliminary source layers SCL1 and SCL2, the first and second preliminary source layers SCL1 and SCL2 may be doped to have a first conductivity type. Thereafter, a plurality of sacrificial layers SL and the insulating layers ILD may be alternately stacked on the second preliminary source layer SCL2.

Figure 22:
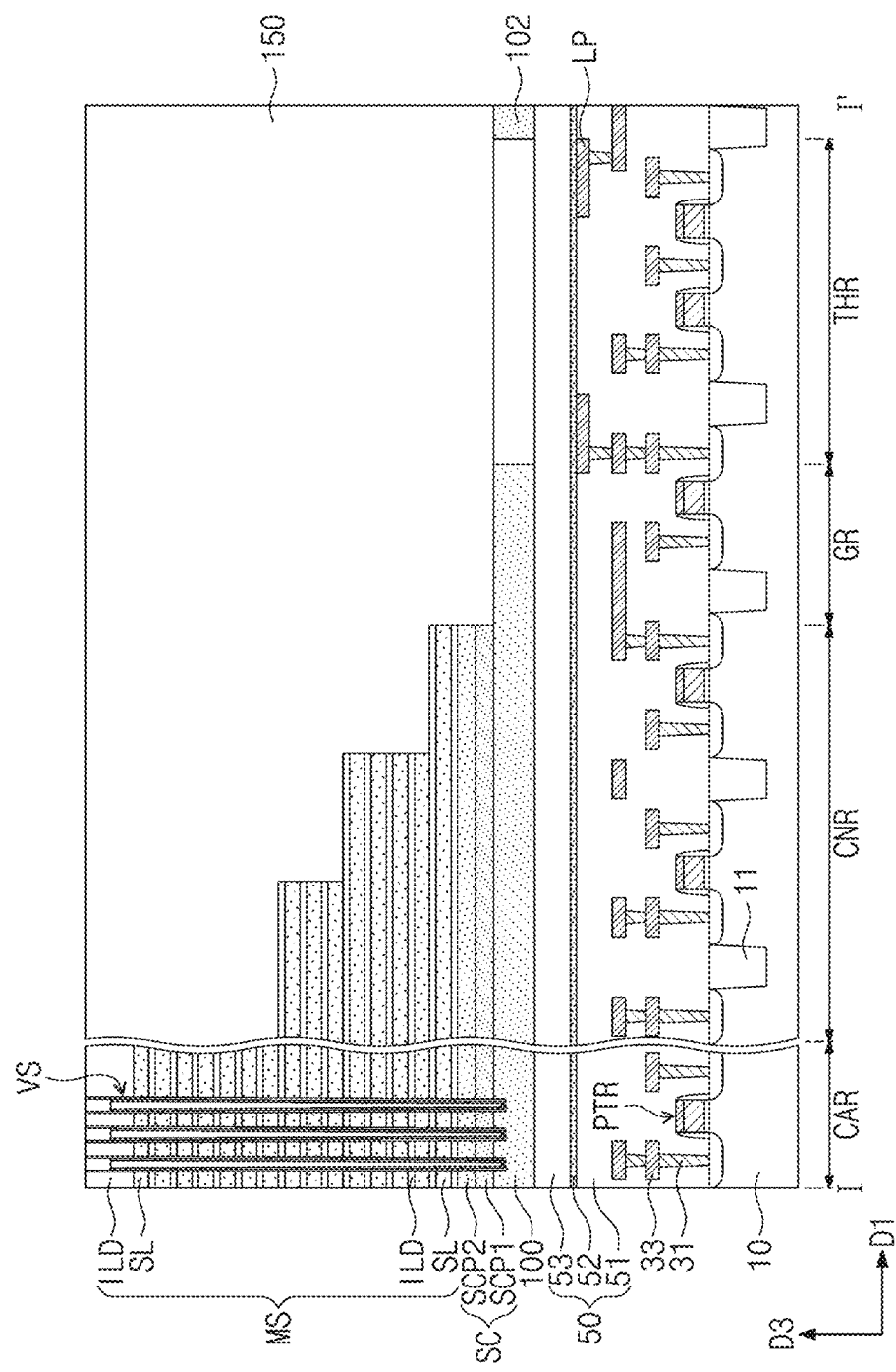

Referring to FIG. 22, a mold structure MS may be formed by performing a trimming process on the sacrificial layers SL and the insulating layers ILD. Here, the trimming process may include steps of forming a mask pattern (not shown) on a layered structure including the sacrificial layers SL and the insulating layers ILD, etching a portion of the layered structure, reducing a planar area of the mask pattern, and removing the mask pattern, and here, the steps of etching a portion of the layered structure and reducing the planar area of the mask pattern may be repeated several times, before the step of removing the mask pattern. As a result of the trimming process, the mold structure MS may be formed to have a stepwise structure on the connection region CNR of the substrate 10. The buried insulating pattern 102 may define the penetration interconnection region THR of the substrate 10. The gap region GR may be defined between the connection region CNR and the penetration interconnection region THR, and the mold structure MS may not be formed on the gap region GR. The uppermost sacrificial layers SL of the mold structure MS may define the cell array region CAR of the substrate 10.

The vertical channel structures VS may be formed to penetrate the mold structure MS. The formation of the vertical channel structures VS may include forming channel holes to penetrate the mold structure MS and forming a semiconductor material in the channel holes using a deposition process. Thereafter, the source structure SC including the first and second horizontal patterns SCP1 and SCP2 may be formed.

The planarization insulating layer 150 may be formed to cover the stepwise region of the mold structure MS. The formation of the planarization insulating layer 150 may include forming a thick insulating layer to cover the mold structure MS and performing a planarization process on the insulating layer. The planarization insulating layer 150 may be formed of or include at least one of insulating materials having an etch selectivity with respect to the sacrificial layers SL.

Figure 23:
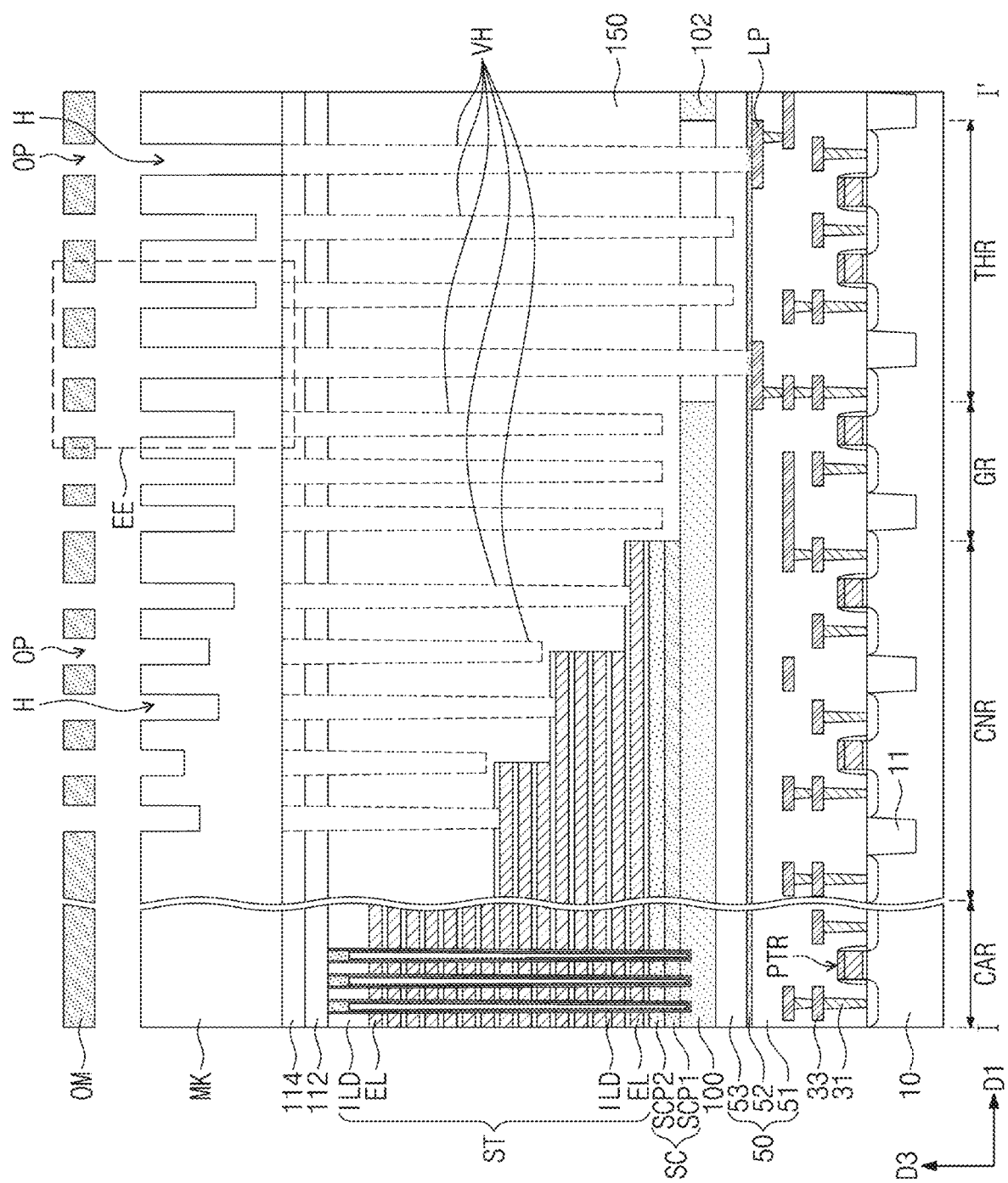

Referring to FIGS. 22 and 23, a process of replacing the sacrificial layers SL with the electrodes EL may be performed. Trenches may be formed to cross the mold structure MS in the first direction D1, and then, the sacrificial layers SL may be removed using an etch recipe, which has an etch selectivity with respect to the insulating layers ILD, the vertical channel structures VS, and the horizontal layer 100. Next, the electrodes EL may be formed by a deposition process of filling empty spaces, which are formed by removing the sacrificial layers SL, with a conductive material. The electrodes EL, along with the insulating layers ILD, may constitute the electrode structure ST.

Referring back to FIG. 23, the first interlayer insulating layer 112 and the second interlayer insulating layer 114 may be formed on the planarization insulating layer 150. Next, a mask pattern MK may be formed on the second interlayer insulating layer 114. The mask pattern MK may include patterning holes H having at least two different depths. The depths of the patterning holes H in the mask pattern MK may vary depending on depths of vertical holes VH to be formed in a subsequent process. The formation of the mask pattern MK may include forming a preliminary mask layer on the second interlayer insulating layer 114 and patterning the preliminary mask layer through a photolithography process using an optical mask OM as a photomask.

For example, referring to FIGS. 23, 24, and 25, the preliminary mask layer may be thickly formed on the top surface of the second interlayer insulating layer 114. The preliminary mask layer may be formed of or include, for example, a photoresist material. In an example embodiment, the preliminary mask layer may be formed using a spin coating process. Next, the preliminary mask layer may be irradiated with a transmission light Ltr passing through the optical mask OM. The optical mask OM may be formed to have openings OP exposing the preliminary mask layer. A portion of an input light Lin, which is incident into a surface of the optical mask OM, may form the transmission light Ltr that passes through the openings OP and is incident into the preliminary mask layer. Thereafter, the mask pattern MK may be formed by developing the preliminary mask layer irradiated with the transmission light Ltr.

A light amount of the transmission light Ltr may be controlled by light-amount control patterns LCP. For example, the openings OP may include a first opening OP1, a second opening OP2, and a third opening OP3 that are used to form patterning holes H1, H2, and H3, which have different depths from each other, in the mask pattern MK. Each of the first, second, and third openings OP1, OP2, and OP3 may have a circular shape, when viewed in a plan view. The light-amount control patterns LCP may be formed in the second and third openings OP2 and OP3. In an example embodiment, each of the light-amount control patterns LCP may be a ring-shaped pattern, when viewed in a plan view. For example, the light-amount control patterns LCP may include a plurality of concentric ring-shaped patterns which have diameters different from each other. A light amount of the transmission light Ltr may vary depending on a planar area of the light-amount control patterns LCP occupying the opening OP2 or OP3. The planar area of the light-amount control patterns LCP in the third opening OP3 may be smaller than the planar area of the light-amount control pattern LCP in the second opening OP2, and a light amount per unit area of the transmission light Ltr passing through the third opening OP3 may be smaller than a light amount per unit area of the transmission light Ltr passing through the second opening OP2. In an example embodiment, the light amount of the transmission light Ltr may vary depending on the number of the light-amount control patterns LCP in each of the openings OP1, OP2, and OP3. For example, the number of the light-amount control pattern LCP in the third opening OP3 may be greater than the number of the light-amount control pattern LCP in the second opening OP2, and the light amount per unit area of the transmission light Ltr passing through the third opening OP3 may be smaller than the light amount per unit area of the transmission light Ltr passing through the second opening OP2.

In an example embodiment, the light-amount control patterns LCP may have a stripe shape and may be provided to cross the second and third openings OP2 and OP3 in a specific direction.

Due to the afore-described difference in the light amount per unit area of the transmission light Ltr, the patterning holes H1, H2, and H3 may be formed in the mask pattern MK to have different depths from each other. A depth of a second patterning hole H2 corresponding to the second opening OP2 may be smaller than a depth of a first patterning hole H1 corresponding to the first opening OP1 and may be larger than a depth of a third patterning hole H3 corresponding to the third opening OP3. In an example embodiment, the light-amount control patterns LCP may not be provided in the first opening OP1, and the first patterning hole H1 may be formed to vertically penetrate the mask pattern MK and to expose the top surface of the second interlayer insulating layer 114.

In an example embodiment, the optical mask OM may be placed on a top surface of the preliminary mask layer such that it vertically overlaps the preliminary mask layer. However, in an example embodiment, the optical mask OM may be placed on a propagation path of the input light Lin, which is incident into the mask pattern MK, not on the top surface of the preliminary mask layer.

In an example embodiment, an exposure process for forming the mask pattern MK may be performed using a reflection-type optical mask, not using a transmission-type optical mask. In an example embodiment, the mask pattern MK may be formed by a lithography process using extreme ultraviolet (EUV) light. The lithography process using the EUV light may include performing an exposing process of irradiating the EUV light onto a photoresist layer and performing a developing process. As an example, the photoresist layer may be an organic photoresist layer containing an organic polymer (e.g., polyhydroxystyrene). The organic photoresist layer may further include a photosensitive compound, which can react with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

Figure 26:
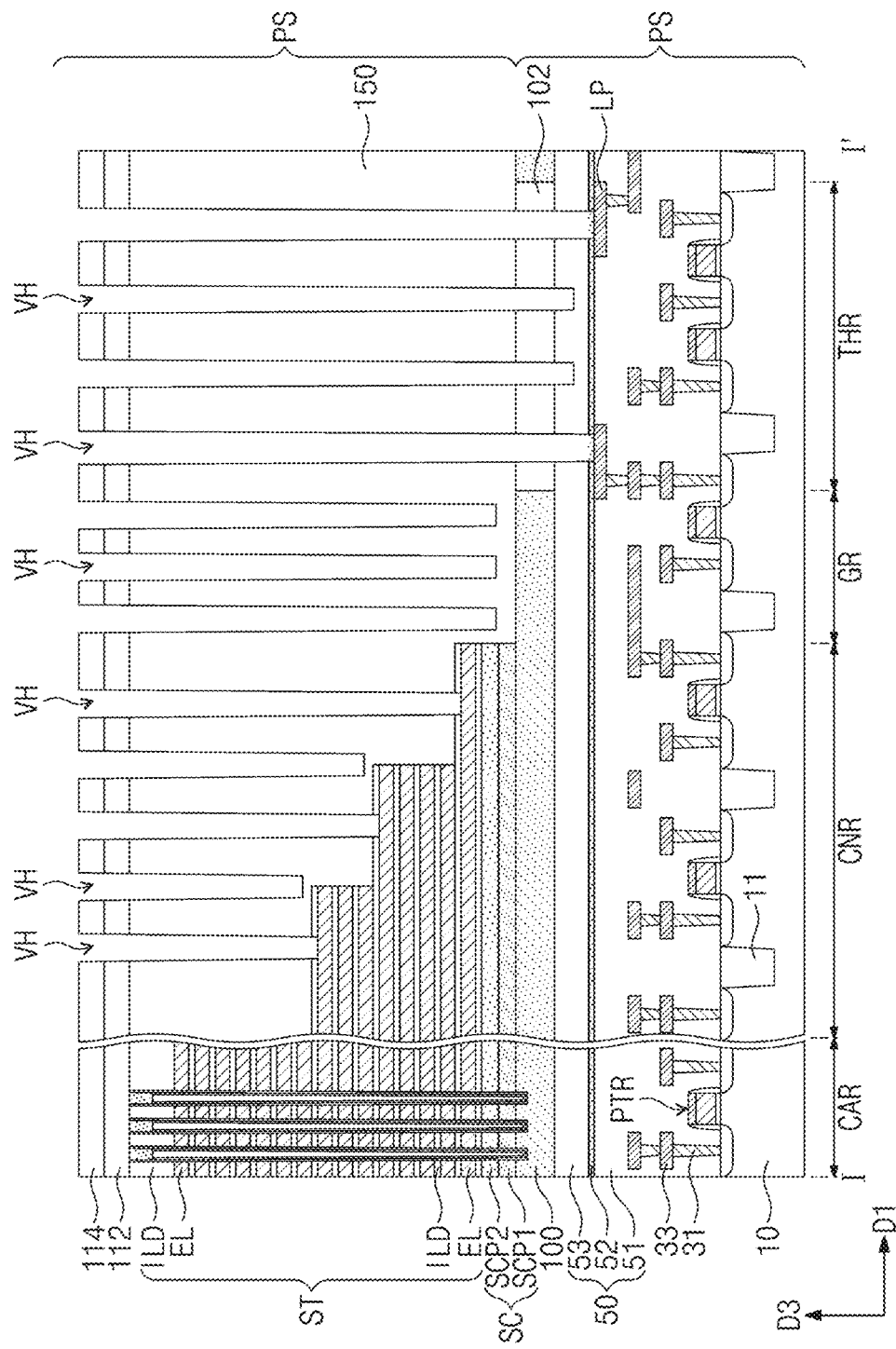

Referring to FIGS. 23 and 26, the vertical holes VH having at least two different depths may be formed by performing an etching process using the mask pattern MK as an etch mask. The depths of the vertical holes VH may depend on the depths of the patterning holes H. The vertical holes VH may be formed to penetrate the first interlayer insulating layer 112 and the second interlayer insulating layer 114 and may have bottom surfaces that are located at a level lower than the top surface of the planarization insulating layer 150. For example, the bottom surfaces of the vertical holes VH on the top surface of the horizontal layer 100 may be located at a level higher than the top surface of the horizontal layer 100.

Figure 27:
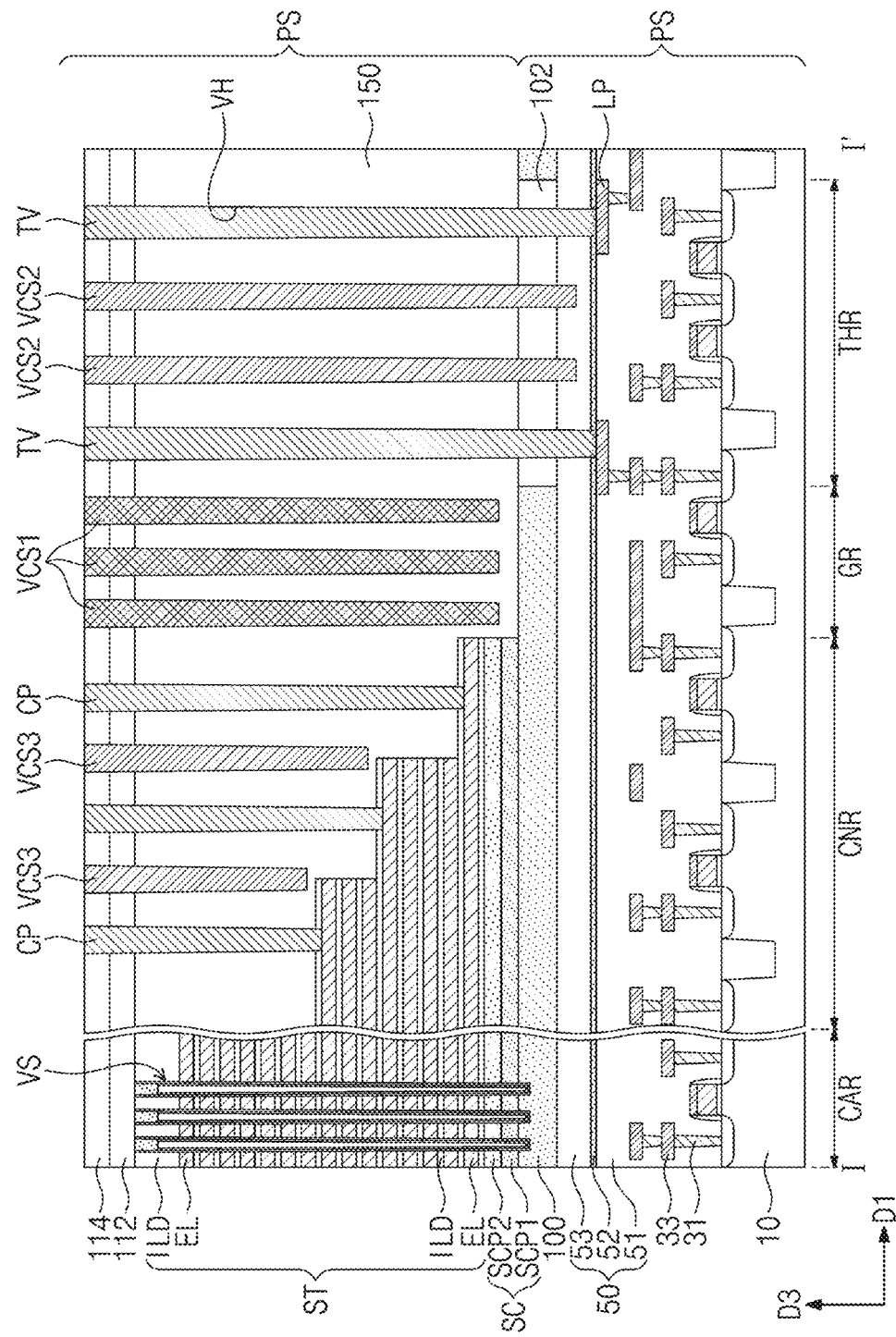

Referring to FIG. 27, the contact plug CP, the vertical conductive structures VCS1, VCS2, and VCS3, and the penetration vias TV may be formed. The formation of the contact plug CP, the vertical conductive structures VCS1, VCS2, and VCS3, and the penetration vias TV may include filling the vertical holes VH with a conductive material. For example, the conductive material may include tungsten. In an example embodiment, a planarization process may be performed on the conductive material, after the filling of the vertical holes VH. Accordingly, the contact plug CP, the vertical conductive structures VCS1, VCS2, and VCS3, and the penetration vias TV may have top surfaces that are substantially coplanar with each other.

Referring back to FIG. 7, the third interlayer insulating layer 116 may be formed on the second interlayer insulating layer 114, and the bit line plugs BP and the upper plug UP may be formed to penetrate at least a portion of the interlayer insulating layers 112, 114, and 116. Thereafter, the bit lines BL and the upper interconnection lines CL may be formed on the third interlayer insulating layer 116. The formation of the bit lines BL and the upper interconnection lines CL may include forming a conductive layer on the third interlayer insulating layer 116 and patterning the conductive layer. The upper interconnection lines CL may be patterned to connect the contact plugs CP to the penetration vias TV. In an example embodiment, the upper interconnection lines CL may be patterned to connect the contact plugs CP to the penetration vias TV in a one-to-one manner.

According to an example embodiment of the inventive concepts, vertical conductive structures may be formed in a planarization insulating layer covering a memory structure. The vertical conductive structures may mitigate or prevent a semiconductor device from being deformed, and thus, it may be possible to improve durability of the semiconductor device and to mitigate or prevent a crack from occurring in regions adjacent to a penetration interconnection region.

Further, the vertical conductive structures may be configured to exhaust impurity gases in the semiconductor device, and thus, it may be possible to reduce a failure rate in a process of fabricating the semiconductor device and to improve reliability of the semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a peripheral circuit structure on a substrate;
   a horizontal layer on the peripheral circuit structure, the horizontal layer including a semiconductor material;
   an electrode structure including electrodes stacked on the horizontal layer, the electrodes including pads arranged in a stepwise shape;
   a planarization insulating layer covering the pads;
   a contact plug penetrating the planarization insulating layer and coupled to one of the pads;
   a penetration via penetrating the planarization insulating layer and coupled to the peripheral circuit structure; and
   a vertical conductive structure between the electrode structure and the penetration via, the vertical conductive structure being in an electrically-floated state,
   wherein the vertical conductive structure has a bottom surface located at a level that is higher than a top surface of the horizontal layer and is lower than a bottom end of the contact plug.

2. The semiconductor device of claim 1, wherein the vertical conductive structure is between a side surface of a lowermost one of the electrodes and the penetration via.

3. The semiconductor device of claim 1, further comprising:
   an electrode separation structure crossing the electrode structure in a first direction parallel to a top surface of the substrate,
   wherein a top surface of the vertical conductive structure is at a level higher than a top surface of the electrode separation structure.

4. The semiconductor device of claim 1, further comprising:
   an upper interconnection line on the planarization insulating layer, the upper interconnection line connecting the contact plug to the penetration via,
   wherein the vertical conductive structure is electrically disconnected from the upper interconnection line.

5. The semiconductor device of claim 1, wherein a top surface of the vertical conductive structure is at a same vertical level as a top surface of the penetration via.

6. The semiconductor device of claim 3, wherein a bottom surface of the electrode separation structure is at a level between a top surface of a lowermost one of the electrodes and a bottom surface of the horizontal layer.

7. The semiconductor device of claim 1, wherein the bottom surface of the vertical conductive structure has a width smaller than that of a top surface of the vertical conductive structure.

8. The semiconductor device of claim 1, wherein the vertical conductive structure comprises a plurality of conductive pillars in an electrically floated state.

9. The semiconductor device of claim 1, wherein
   the vertical conductive structure comprises a first conductive pillar and a second conductive pillar, and
   bottom surfaces of the first conductive pillar and the second conductive pillar are at levels different from each other.

10. The semiconductor device of claim 1, wherein a top surface of the vertical conductive structure is at a level lower than a top surface of the contact plug.

11. The semiconductor device of claim 1, further comprising:
    a second vertical conductive structure vertically overlapping one of the pads,
    wherein the second vertical conductive structure has a bottom surface at a level between a top surface of the one of the pads and a top surface of the electrode structure.

12. The semiconductor device of claim 1, further comprising:
    a second vertical conductive structure vertically overlapping one of side surfaces of the electrodes,
    wherein the second vertical conductive structure has a bottom surface at a level between a top surface of one of the pads and a top surface of the electrode structure.

13. A semiconductor device, comprising:
    a substrate including a cell array region, a connection region, and a peripheral line region, which are arranged in a first direction;
    a peripheral circuit structure having a peripheral circuit on the substrate and a landing pad connected to the peripheral circuit;
    a horizontal layer on the peripheral circuit structure;
    an electrode structure including electrodes stacked on the horizontal layer, the electrodes having a staircase structure on the connection region;
    an electrode separation structure crossing the electrode structure in the first direction;
    vertical channel structures on the cell array region and penetrating the electrode structure;
    a planarization insulating layer covering the electrode structure;
    a contact plug on the connection region, the contact plug penetrating the planarization insulating layer and coupled to one of the electrodes;
    a penetration via on the peripheral line region, the penetration via penetrating the planarization insulating layer and coupled to the landing pad;
    an upper interconnection line on the planarization insulating layer, the upper interconnection line connecting the contact plug to the penetration via; and
    a vertical conductive structure between the electrode structure and the penetration via,
    wherein the vertical conductive structure has a bottom surface covered with the planarization insulating layer.

14. The semiconductor device of claim 13, wherein the vertical conductive structure is electrically disconnected from the upper interconnection line.

15. The semiconductor device of claim 13, wherein the vertical conductive structure is between the penetration via and a side surface of a lowermost one of the electrodes.

16. The semiconductor device of claim 13, wherein a top surface of the vertical conductive structure is at a level higher than a top surface of the electrode separation structure.

17. The semiconductor device of claim 13, wherein a top surface of the vertical conductive structure is at a same vertical level as a top surface of the penetration via.

18. The semiconductor device of claim 13, wherein the vertical conductive structure comprises a plurality of conductive pillars in an electrically floated state.

19. An electronic system, comprising:
    a main substrate;
    a semiconductor device on the main substrate; and
    a controller on the main substrate and electrically connected to the semiconductor device,
    wherein the semiconductor device comprises,
    a peripheral circuit structure having a peripheral circuit on a substrate and a landing pad connected to the peripheral circuit, an electrode structure including electrodes stacked on the peripheral circuit structure, the electrodes including pads arranged in a stepwise shape, a planarization insulating layer covering the pads, a contact plug penetrating the planarization insulating layer and coupled to one of the pads, a penetration via penetrating the planarization insulating layer and coupled to the landing pad, and a vertical conductive structure between the contact plug and the penetration via, and wherein the vertical conductive structure has a bottom surface covered with the planarization insulating layer.

20. The electronic system of claim 19, wherein the main substrate further comprises interconnection patterns electrically connecting the semiconductor device to the controller, the semiconductor device further comprises a horizontal layer between the peripheral circuit structure and the electrode structure, and the bottom surface of the vertical conductive structure is at a level higher than a top surface of the horizontal layer.

\* \* \* \* \*